United States Patent
Bhagwagar et al.

(10) Patent No.: US 11,021,607 B2
(45) Date of Patent: Jun. 1, 2021

(54) METAL-POLYORGANOSILOXANES

(71) Applicant: Dow Silicones Corporation, Midland, MI (US)

(72) Inventors: Dorab E Bhagwagar, Saginaw, MI (US); Cameron J Kadleck, Midland, MI (US); Adriana P Zambova, Midland, MI (US)

(73) Assignee: Dow Silicones Corporation, Midland, MI (US)

( * ) Notice: Subject to any disclaimer, the term of this patent is extended or adjusted under 35 U.S.C. 154(b) by 84 days.

(21) Appl. No.: 16/087,213

(22) PCT Filed: Mar. 23, 2017

(86) PCT No.: PCT/US2017/023744
§ 371 (c)(1),
(2) Date: Sep. 21, 2018

(87) PCT Pub. No.: WO2017/165608
PCT Pub. Date: Sep. 28, 2017

(65) Prior Publication Data
US 2019/0100650 A1    Apr. 4, 2019

Related U.S. Application Data

(60) Provisional application No. 62/312,043, filed on Mar. 23, 2016.

(51) Int. Cl.
| | | |
|---|---|---|
| *C08L 83/04* | (2006.01) | |
| *C09K 5/14* | (2006.01) | |
| *C08K 3/08* | (2006.01) | |
| *C08K 5/5419* | (2006.01) | |
| *H01L 23/373* | (2006.01) | |
| *H01L 23/42* | (2006.01) | |
| *C08K 9/06* | (2006.01) | |
| *C08G 77/398* | (2006.01) | |
| *C08K 3/22* | (2006.01) | |

(52) U.S. Cl.
CPC ............ *C08L 83/04* (2013.01); *C08G 77/398* (2013.01); *C08K 3/08* (2013.01); *C08K 3/22* (2013.01); *C08K 5/5419* (2013.01); *C08K 9/06* (2013.01); *C09K 5/14* (2013.01); *H01L 23/3737* (2013.01); *H01L 23/42* (2013.01); *C08K 2003/0812* (2013.01); *C08K 2003/2227* (2013.01); *C08K 2003/2296* (2013.01); *C08K 2201/003* (2013.01)

(58) Field of Classification Search
CPC ...... C08L 83/04; H01L 23/3737; H01L 23/42; C08G 77/398; C08K 9/06; C08K 3/22; C08K 3/08; C08K 5/5419; C08K 5/14; C08K 2003/0812; C08K 2003/2227; C08K 2003/2296; C08K 2201/003; C08K 2201/005
See application file for complete search history.

(56) References Cited

U.S. PATENT DOCUMENTS

| | | |
|---|---|---|
| 4,087,585 A | 5/1978 | Schulz |
| 4,477,626 A | 10/1984 | Suzuki |
| 4,766,176 A | 8/1988 | Lee et al. |
| 4,962,076 A | 10/1990 | Chu et al. |
| 5,017,654 A | 5/1991 | Togashi et al. |
| 5,051,455 A | 9/1991 | Chu et al. |
| 5,053,442 A | 10/1991 | Chu et al. |
| 5,194,649 A | 3/1993 | Okawa |
| 5,248,715 A | 9/1993 | Gray et al. |
| 5,527,932 A | 6/1996 | Kasuya |
| 5,744,507 A | 4/1998 | Angell et al. |
| 6,169,142 B1 | 1/2001 | Nakano et al. |
| 6,486,288 B1 | 11/2002 | Ziche et al. |
| 6,555,905 B2 | 4/2003 | Yamada et al. |
| 7,338,996 B2 | 3/2008 | Fehn et al. |
| 7,491,356 B2 | 2/2009 | Heikkila |
| 7,732,553 B2 | 6/2010 | Hawker et al. |
| 7,754,330 B2 | 7/2010 | Hamada et al. |
| 7,939,614 B2 | 5/2011 | Sueyoshi et al. |
| 7,994,057 B2 | 8/2011 | Dysard et al. |
| 8,142,895 B2 | 3/2012 | Khanarian et al. |
| 8,183,307 B2 | 5/2012 | Prasse |
| 8,258,502 B2 | 9/2012 | Yoshitake et al. |

(Continued)

FOREIGN PATENT DOCUMENTS

| | | |
|---|---|---|
| CN | 103694707 | 4/2014 |
| EP | 304958 | 3/1989 |

(Continued)

OTHER PUBLICATIONS

Gelest, Silane Coupling Agents: Connecting Across Boundaries, 2014, p. 1-72.*
Coleman, E.A.; Applied Plastics Engineering Handbook, 2011, Chapter 23, p. 419-428.*
Plueddemann, E.P.; Silane Coupling Agents, 1982, Chapters 4 & 7, p. 75-109 & 167-205.*
Sip, Christopher, "Stable chemical bonding of porous membranes and poly(dimethylsiloxane) devices for long-term cell culture", Biomicrofluidics, 2014, vol. 8 No. 3.

(Continued)

*Primary Examiner* — Robert S Jones, Jr.

(57) ABSTRACT

Metal-polyorganosiloxane materials, methods of making and using them, and manufactured articles and devices containing them are disclosed. The metal-polyorganosiloxane materials have improved thermal stability and comprises a metal-polyorganosiloxane mixture that is free of condensation-curable polyorganosiloxane and solid particles other than metal particles and ceramic particles, the metal-organosiloxane mixture otherwise comprising: (A) a polyorganosiloxane that is free of silicon-bonded organoheteryl groups; (B) a hydrocarbylene-based multipodal silane; and (C) metal particles.

17 Claims, No Drawings

(56) References Cited

U.S. PATENT DOCUMENTS

| | | | |
|---|---|---|---|
| 8,399,548 | B2 | 3/2013 | Prasse |
| 8,557,940 | B2 | 10/2013 | Chang et al. |
| 9,080,057 | B2 | 7/2015 | Backer et al. |
| 9,359,529 | B2 | 6/2016 | Liu et al. |
| 9,656,911 | B2 | 5/2017 | Pankiewicz et al. |
| 9,828,470 | B2 | 11/2017 | Monteil et al. |
| 10,077,339 | B2 | 9/2018 | Fujisawa et al. |
| 10,155,852 | B2 | 12/2018 | Enami |
| 10,563,015 | B2 | 2/2020 | Gubbels et al. |
| 2002/0010245 | A1 | 1/2002 | Enami et al. |
| 2002/0014692 | A1 | 2/2002 | Yamada et al. |
| 2005/0027138 | A1 | 2/2005 | Janeiro et al. |
| 2006/0000389 | A1 | 1/2006 | Duguet et al. |
| 2006/0004121 | A1 | 1/2006 | Ding et al. |
| 2006/0094809 | A1 | 5/2006 | Simone et al. |
| 2007/0131912 | A1 | 6/2007 | Simone et al. |
| 2007/0148599 | A1 | 6/2007 | True |
| 2007/0219312 | A1* | 9/2007 | David ............... C09J 183/04 524/588 |
| 2008/0038559 | A1 | 2/2008 | True |
| 2009/0127801 | A1 | 5/2009 | Heikkila |
| 2009/0314482 | A1 | 12/2009 | Heikkila |
| 2010/0040858 | A1 | 2/2010 | Ma et al. |
| 2011/0082356 | A1 | 4/2011 | Yang et al. |
| 2011/0143966 | A1 | 6/2011 | McGall et al. |
| 2013/0033753 | A1 | 2/2013 | Su et al. |
| 2013/0301133 | A1 | 11/2013 | Su et al. |
| 2013/0338312 | A1 | 12/2013 | Tu et al. |
| 2014/0017772 | A1 | 1/2014 | Di Matteo et al. |
| 2014/0162911 | A1 | 6/2014 | Monastiriotis et al. |
| 2014/0194019 | A1 | 7/2014 | Greer et al. |
| 2014/0338906 | A1 | 11/2014 | Monastiriotis et al. |
| 2015/0140344 | A1 | 5/2015 | Ma et al. |
| 2015/0210909 | A1 | 7/2015 | Von Malotki et al. |
| 2015/0376481 | A1 | 12/2015 | Larson et al. |
| 2016/0032060 | A1 | 2/2016 | Jiang et al. |
| 2017/0152350 | A1 | 6/2017 | Heikkinen et al. |

FOREIGN PATENT DOCUMENTS

| | | |
|---|---|---|
| EP | 409272 | 1/1991 |
| EP | 493791 | 7/1992 |
| EP | 572927 | 12/1993 |
| JP | 2010052986 | 3/2010 |
| JP | 2010229192 | 10/2010 |
| KR | 2005064087 | 6/2005 |
| KR | 550770 | 2/2006 |
| WO | 2007081410 | 7/2007 |
| WO | 2013079939 | 6/2013 |
| WO | 2014058420 | 4/2014 |
| WO | 2015009349 | 1/2015 |

OTHER PUBLICATIONS

Nikje, Mir Mohammad Alavi, "Preparation and Characterization of Magnetic Rigid Polyurethane Foam Reinforced with Dipodal Silane Iron Oxide Nanoparticles FE3O4@APTS/GPTS", Cellular Polymers, 2015, vol. 34, No. 3, pp. 137-156.

Nikje, Mir Mohammad Alavi, "Preparation of Polyurethane Flexible Foam Nanocomposites by Incorporation of Fe3O4 Nanoparticles Modified by Reaction Product of GPTS and APTS", Cellular Polymers, 2015, vol. 34, No. 5, pp. 249-262.

Arkles, Barry, "Enhanced Hydrolytic Stability of Siliceous Surfaces Modified with Pendant Dipodal Silanes", Chemistry—A European Journal, 2014, vol. 20 No. 30, pp. 9442-9450.

Nikje, Mir Mohammad Alavi, "Novel Modified Nanosilica-Based on Synthesized Dipodal Silane and Its Effects on the Physical Properties of Rigid Polyurethane Foams", Designed Monomers and Polymers, 2010, vol. 13 No. 3, pp. 249-260.

Zazyczny, Joel, "Dlpodal Silanes: Enhanced Substrate Adhesion", Adhesives & Sealants Industry, 2008.

Silane Coupling Agents: Connecting Across Boundaries, Gelest,Inc., 2006, pp. 1-56.

McNaught. "Compendium of Chemical Terminology, 2nd ed. (the "Gold Book")". Blackwell Scientific Publications, Oxford (2014).

Pern, F.J. "Enhanced Adhesion of EVA Laminates to Primed Glass Substrates Subjected to Damp Heat Exposure". Conference Record of the IEEE Photovoltaic Specialists Conference (2005), vol. 31.

Gurjaspreet, Singh, "Synthesis and Characterization of Silatranes Derived From 3-Aminopropyl-Methyl-Diethoxysilane", Journal of Applicable Chemistry, 2014, vol. 3, pp. 1031-1035.

Bruehwiler, Dominik, "Structure of Ni(II) and Ru(III) Ammine Complexes Grafted onto Mesoporous Silicate Sieve", Journal of Physical Chemistry B, (2003), pp. 8547-8556.

Singh, Mani, "Dipodal Silanes: Important Tool for Surface Modification to Improve Durability", MRS Online Proceedings Library, (2014), vol. 1648.

Kelleher, "Multivalent linkers for improved covalent binding of oligonucleotides to dye-doped silica nanoparticles", Nanotechnology, (2015), vol. 26, No. 36.

Jeon, Ha Na, "Studies on the Michael Addition Reaction between Secondary Amino Groupons on the Silica Surface with Poly(ethylene glycol) Diacrylates", Polymer (Korea), (2012), vol. 26, No. 6, pp. 822-830. (English Abstract).

Lee, Sangmi, "Spectroscopic Studies on the Reaction between Amino Groups on Silica Nanoparticle Surface and Glycidyl Methacrylate", Polymer (Korea), (2013), vol. 37, No. 6, pp. 777-783. (English Abstract).

Holberg, Stefan, "Application of a repellent urea-siloxane hybrid coating in the oil industry", Progress in Organic Coatings, (2014), vol. 77, No. 10, pp. 1591-1595.

Zhang, Xiahan, "Adhesion loss at epoxy/glass interfaces under hygrothermal conditions", ProQuest Dissertations and Theses, 2007, vol. 68.

Search report from corresponding China 201780015208.2 application, received Dec. 20, 2019.

Search report from corresponding Taiwan 1061092456 application, received Oct. 16, 2020.

Search report from corresponding Korea 10-2018-7028804 application, dated Feb. 17, 2021.

Search report from corresponding Taiwan 106109246 application, dated Mar. 8, 2021.

Search report from corresponding Japan 2018-545927 application, dated Mar. 8, 2021.

* cited by examiner

METAL-POLYORGANOSILOXANES

CROSS-REFERENCE TO RELATED APPLICATIONS

This application is the National Stage of International Application No. PCT/US2017/023744 filed on 23 Mar. 2017, which claims priority to and all advantages of U.S. Provisional Patent Application No. 62/312,043 filed on 23 Mar. 2016, the content of which is hereby incorporated by reference.

TECHNICAL FIELD

This invention generally relates to metal-polyorganosiloxane materials, methods of making and using them, and manufactured articles and devices containing them.

BACKGROUND TO RELATED ART

Environmentally-sensitive articles experience an undesired fall-off in performance in adverse environments such as light, heat, moisture, or oxygen. Certain plastics discolor or embrittle when exposed to light. Certain metals corrode when exposed to molecular oxygen or water. Other metals facilitate chemical degradation of other materials. Certain mechanical, optical or electronic components underperform or fail when overheated.

Heat dissipation is a critical consideration in design of new opto/electronic packages and boards and modules having two or more optical or electronic components. Particularly vulnerable to heat failure are laser diodes, multiplexers, and transceivers; integrated circuits (ICs) such as flip chip ICs, central processing units (CPUs), microprocessors, power semiconductors and modules, sensors, power supplies, high speed mass storage drives, motor controls, and high voltage transformers; and automotive mechatronics. As package designs, boards and modules become smaller, heat dissipation becomes more important.

To manage heat in opto/electronic package designs, boards, and modules, thermal interface materials (TIMs) are used between components to move heat away from heat-sensitive components to other components such as heat sinks, fan sinks, or heat pipes. TIMs may also couple package lids, baseplates and heat spreaders.

Incumbent thermal interface materials comprise a thermally conductive material (TCM) comprising heat conductive filler particles dispersed in a polymer matrix. The polymer matrix may be an organic polymer or a silicone. To increase mechanical strength of their TCMs, some artisans have formulated their TCM with an interfacial crosslinker, which reacts to form a covalent bond to the polymer matrix and an ionic or covalent bond to the filler particles. The resulting product is a crosslinked TCM comprising a multivalent crosslinker group permanently bonded to both the filler particles and the polymer matrix.

Korean patent application publication number KR 2005-064087A to Y. H. Park (PARK, granted as KR550770B1) generally relates to a one component, room temperature hardening, paste composition comprising one component room temperature hard (sic) silicon resin, a metal powder, and a silane compound having 3 or 4 alkoxide groups. PARK's silicone resin contains hydrolyzable groups that are bonded via their nitrogen or oxygen atoms to silicon atoms and are selected from the denitrification type, deoxime type, dialcohol type, and the group made with acetone type (machine English translation). The silicone resin is moisture curable at room temperature. The silicone resin and the metal powder have very different specific gravities. PARK seeks a way preventing the silicone resin and metal powder from becoming physically segregated from each other. PARK's technical solution is to use a small quantity of the silane compound having 3 or 4 alkoxide groups comprised of gamma aminopropyltriethoxysilane, gamma aminopropyltrimethoxysilane, bistriethoxysilyl ethane, bistrimethoxysilylethane, tetraethoxysilane and tetramethoxysilane. The silane compound exemplified in PARK's working examples is gamma aminopropyltrimethoxysilane ($H_2NCH_2CH_2CH_2Si(OCH_3)_3$). The silane compound is said to react under moisture curing with the surface of the metal powder and with the silicone resin. The water formally displaces a hydrolyzable group from the silicone resin and an alkoxide group from the silane compound so as to form a Si—O-Metal bond sequence comprising an oxygen atom bonded to a silicon atom of the silicone resin and a metal atom, M, at the surface of the metal powder. Thus, PARK's silane compound crosslinks the silicone resin to the metal powder in situ, and thereby prevents them from physically segregating from each other. The metal powder is bonded to the silicone resin (matrix) of the hardened paste.

United States Patent Application Publication Number US 2009/0314482 A1 to K. E. Heikkila et al. (HEIKKILA) generally relates to a metal polymer composite having properties that are enhanced or increased in the composite. Such properties include viscoelastic character, color, magnetism, thermal conductivity, electrical conductivity, density, improved malleability and ductility and thermoplastic or injection molding properties. HEIKKILA's composite is a true composite and comprises a high-density metal particulate, a polymer, and optionally an interfacial modifier material. A thermoplastic or thermoset polymer may be used as the polymer phase. Although a large variety of polymers are said to be used, all the polymers are organic polymers. The interfacial modifier, when present, is said to improve the association of the [metal] particulate with the polymer. HEIKKILA's interfacial modifiers fall into broad categories including, for example, stearic acid derivatives, silane compounds, titanate compounds, zirconate compounds, and aluminate compounds. The silane interfacial modifiers are said to improve physical properties of the composites by forming chemical bonds between the metal particle and the continuous polymer phase or by modifying the surface energy of the inorganic metal particulate matching the surface energy of the polymer at the particle polymer interface. Silane coupling agents include, among others, dipodal silanes of formula $R[(CH_2)_n-Si-X_3]_2$, wherein R represents the non-hydrolyzable organic group of the silane compound. X seems to represent a hydrolyzable group comprising alkoxy, acyloxy, halogen or amine depending on the surface chemistry of the metal particulate and the reaction mechanism. HEIKKILA says dipodal silanes such as bis(triethoxysilyl) ethane are chosen when a composite will be used in an application including large amounts of aqueous media and broad temperature excursions. HEIKKILA emphasizes that the manufacture of the high density metal particulate composite materials depends on good manufacturing technique. Often the metal particulate is initially treated with an interfacial modifier such as a reactive silane by spraying the particulate with a 25 wt % solution of the silane or other interfacial modifier on the metal with blending and drying carefully to ensure uniform particulate coating of the interfacial modifiers. Interfacial modifiers such as silanes may also be added to particles in bulk blending operations using high density Littleford or Henschel blenders. Alternatively, twin cone mixers can be followed by drying or direct addition to a screw compounding device. Interfacial modifiers may also be reacted with the metal particulate in aprotic solvent such as toluene, tetrahydrofuran, mineral spirits or other such known solvents. After initial treatment with the interfacial modifier, the treated metal particulate can then be coupled to the polymer phase depending on the nature of the polymer phase, the filler, the particulate surface chemistry and any pigment process aid or additive present in the composite material. Thus to form the composite, HEIKKILA pretreats the surface of the metal particulate with the interfacial modifier (crosslinker) to form an interfacial modifier-bonded metal particulate. Subsequently, HEIKKILA contacts the resulting interfacial modifier-bonded metal particulate with the polymer to bond the interfacial modifier portion of the interfacial modifier-bonded metal particulate to the polymer phase (matrix), thereby forming the metal polymer composite.

Incumbent thermally conductive materials, however, are thermally unstable and vulnerable to a variety of modes of heat failure. These modes include thermal expansion/stress leading to debonding or delamination (e.g., due to lack or loss of flexibility, cohesiveness or adhesiveness), material fatigue such as embrittlement or cracking (e.g., due to hardening), thermal shock defects such as scribing or phase separation, outgassing of trapped materials leading to corrosion and/or voiding (e.g., during hardening), and migration of contaminants to TIM surfaces. For example, PARK's hardened paste and HEIKKILA's metal polymer composite would suffer from a loss of flexibility and, when heated, an increased hardening/cracking due to the mechanical rigidity imposed by the crosslinking of their metal particles to their polymer matrix.

BRIEF SUMMARY OF THE INVENTION

We have discovered metal-polyorganosiloxane materials, methods of making and using them, and manufactured articles and devices containing them that solve one or more of the aforementioned problems of incumbent TCMs. Our metal-polyorganosiloxane materials may be used as thermally conductive materials, including as thermal interface materials. The metal-polyorganosiloxane materials may beneficially decrease one or more aforementioned modes of heat failure. While initially developed for heat management, the metal-polyorganosiloxane materials may also be used in athermal applications and devices.

DETAILED DESCRIPTION OF THE INVENTION

The Brief Summary and Abstract are incorporated here by reference. The metal-polyorganosiloxane materials independently include a metal-polyorganosiloxane mixture, a metal-polyorganosiloxane composition, a cured composite, and a thermally-aged material.

The metal-polyorganosiloxane mixture is free of a condensation-curable polyorganosiloxane and solid particles other than metal particles and ceramic particles. Other than that limitation, the metal-organosiloxane mixture comprises any other constituents, including (A) to (C): (A) a polyorganosiloxane that is free of silicon-bonded organoheteryl groups; (B) a hydrocarbylene-based multipodal silane, and (C) metal particles. The metal-polyorganosiloxane mixture may be prepared by mixing constituents (A) to (C), and optionally 0, 1, 2, or 3 or more of any optional constituents described later (e.g., a rheology modifier such as constituent (I) rheology modifier described later), to give the metal-polyorganosiloxane mixture.

The metal-polyorganosiloxane composition is free of a condensation-curable polyorganosiloxane and solid particles other than metal particles and ceramic particles. Other than that limitation, the metal-organosiloxane composition comprises constituents (A) and (B'-C'): (A) a polyorganosiloxane that is free of silicon-bonded organoheteryl groups; and (B'-C') hydrocarbylene-based multipodal silanoxy-functionalized metal particles. In constituent (B'-C'), each hydrocarbylene-based multipodal silanoxy-functionalized metal particle contains at least one Si—O-Metal bond between the hydrocarbylene-based multipodal silanoxy functional group and the metal particle. The metal-polyorganosiloxane composition may be prepared from the metal-polyorganosiloxane mixture by allowing constituents (B) and (C) of the metal-polyorganosiloxane mixture to react with each other in situ as discussed below to give the metal-polyorganosiloxane composition. The metal-polyorganosiloxane mixture differs from the metal-polyorganosiloxane composition in one or more aspects, including that the metal-polyorganosiloxane composition contains (B'-C') hydrocarbylene-based multipodal silanoxy-functionalized metal particles, whereas the metal-polyorganosiloxane mixture does not contain the constituent (B'-C').

Each of the metal-polyorganosiloxane mixture and the metal-polyorganosiloxane composition independently may be formulated to be non-curable or addition-curable. Embodiments of the metal-polyorganosiloxane mixture that are addition-curable refer to post-reaction addition-curable formulations of the metal-polyorganosiloxane mixture wherein constituent (A) is an addition-curable polyorganosiloxane that is free of silicon-bonded organoheteryl groups, and reaction conditions for constituents (B) and (C), or orders of addition of any optional constituents, are chosen such that constituents (B) and (C) may react in situ with each other in the presence of constituent (A) and before constituent (A) undergoes any or significant curing, thereby giving an addition-curable metal-polyorganosiloxane composition. For example, a post-reaction addition-curable formulation of the addition-curable metal-polyorganosiloxane mixture may be one wherein constituent (A) is hydrosilylation curable and the mixture further comprises a SiH-functional crosslinker and a thermoplastic-microencapsulated hydrosilylation catalyst, wherein constituents (B) and (C) have a lower reaction temperature with each other than the softening point (softening temperature) of the thermoplastic of the thermoplastic-microencapsulated hydrosilylation catalyst. Before softening, the thermoplastic encapsulates the hydrosilylation catalyst, thereby preventing the latter from contacting the addition-curable constituent (A). Once softened, the thermoplastic would separate from the underlying hydrosilylation catalyst, thereby exposing the hydrosilylation catalyst to, and enabling post-reaction hydrosilylation curing of, the hydrosilylation-curable constituent (A). For example, constituents (B) and (C) may be chosen that react with each other at a reaction temperature of from 40° to 80° C., whereas the thermoplastic-microencapsulated hydrosilylation catalyst may be chosen to contain a thermoplastic that does not soften until it reaches a temperature of >80° C., e.g., 100° C. or higher. Thus, heating the addition-curable metal-polyorganosiloxane mixture comprising the foregoing example constituents at a temperature of, say, 60° C., for a time sufficient to enable in situ reaction of the chosen constituents (B) and (C) gives the example addition-curable metal-polyorganosiloxane composition. Alternatively, an in situ reaction of constituent (B) with constituent (C) in the metal-polyorganosiloxane mixture may give a first metal-polyorganosiloxane composition comprising constituent (A) and a reaction product, constituent (B'-C'), and then a crosslinker (e.g., constituent (E) described later) and/or a cure catalyst (e.g., constituent (F) described later) may be added to the first metal-polyorganosiloxane composition to give a second metal-polyorganosiloxane composition comprising constituents (A), (B'-C'), and (E) and/or (F).

Embodiments of the metal-polyorganosiloxane mixture that are non-curable refer to formulations of the metal-polyorganosiloxane mixture wherein either the constituent (A) is a non-curable polyorganosiloxane that is free of silicon-bonded organoheteryl groups and the mixture is free of any curable polyorganosiloxane; or formulations wherein the constituent (A) is an addition-curable polyorganosiloxane that is free of silicon-bonded organoheteryl groups and the mixture is free of a cure catalyst; or formulations wherein the constituent (A) is an addition-curable polyorganosiloxane that is free of silicon-bonded organoheteryl groups and the mixture is free of a crosslinker; or formulations wherein the constituent (A) is an addition-curable polyorganosiloxane that is free of silicon-bonded organoheteryl groups and the mixture is free of a cure catalyst and crosslinker. Typical embodiments of the non-curable metal-polyorganosiloxane mixture are those formulations wherein the constituent (A) is an addition-curable polyorganosiloxane that is free of silicon-bonded organoheteryl groups and the metal-polyorganosiloxane mixture is free of a cure catalyst and crosslinker, or formulations wherein the constituent (A) is a non-curable polyorganosiloxane that is free of silicon-bonded organoheteryl groups. Optionally, the metal-polyorganosiloxane mixture wherein the constituent (A) is the non-curable polyorganosiloxane is free of a cure catalyst and crosslinker.

The cured composite may be prepared from, by curing, the addition-curable metal-polyorganosiloxane composition. The addition-curable metal-polyorganosiloxane composition typically comprises the addition-curable constituent (A), a crosslinker reactable with the addition-curable constituent (A) (e.g., see constituent (E) crosslinker described later), and a cure catalyst effective for enhancing the reaction of the addition-curable constituent (A) with the crosslinker (see constituent (F) cure catalyst described later). The cured composite comprises the (B'-C') hydrocarbylene-based multipodal silanoxy-functionalized metal particles and a product of curing the addition-curable constituent (A) and crosslinker. The constituent (B'-C') may be a by-stander during the curing of the addition-curable constituent (A) and crosslinker. The cured composite differs from the metal-polyorganosiloxane composition in one or more aspects, including that the cured composite contains an addition-cured polyorganosiloxane, whereas the metal-polyorganosiloxane composition does not. The addition-curable metal-polyorganosiloxane composition may be formulated in such a way that the cured composite prepared therefrom contains a matrix phase comprising the addition-cured polyorganosiloxane and a particulate phase comprising the constituent (B'-C') widely dispersed therein. The dispersion of the constituent (B'-C') in the matrix phase may be stable against settling under force of gravity.

The thermally-aged material comprises a thermally-aged non-curable metal-polyorganosiloxane composition or a thermally-aged composite. The thermally-aged non-curable composition may be prepared by heating the non-curable metal-polyorganosiloxane composition at a temperature from 100° C. to 350° C. for at least 1 day. The thermally-aged composite may be prepared by heating the cured composite at a temperature from 100° C. to 350° C. for at least 1 day. The heating period may be continuous or discontinuous (i.e., cumulative). The thermally-aged material independently differs from the non-curable metal-polyorganosiloxane composition and from the cured composite in one or more aspects, including that the thermally-aged material has been thermally aged, whereas the non-curable metal-polyorganosiloxane composition and cured composite have not been thermally aged. As a result of being thermally aged, the thermally-aged material may have a different property than that of the non-curable metal-polyorganosiloxane composition and, independently, that of the cured composite. The different property independently may be a chemical property, a compositional property, an electrical property, a mechanical, an optical, a physical property, a spectrographic property, a thermal property, or a combination of any two or more of these properties. The chemical property may be adhesive strength or crosslinking density. The compositional property may be the presence or absence of a volatile constituent. The electrical property may be volume resistivity. The mechanical property may be tensile strength. The optical property may be visible light transmittance (e.g., extent of yellowing). The physical property may be density or dynamic viscosity at 25° C. The spectrographic property may be a difference in Silicon-29 nuclear magnetic resonance ($^{29}$Si-NMR) spectrums and/or Fourier Transform-Infrared (FT-IR) spectrums. The thermal property may be thermal conductivity, thermal diffusivity, thermal impedance, or a combination of any two or three thereof. In some aspects, the different property may be dynamic viscosity at 25° C., hardness (e.g., Shore A hardness), thermal conductivity, a combination of dynamic viscosity and hardness, a combination of dynamic viscosity and thermal conductivity, a combination of hardness and thermal conductivity, or a combination of dynamic viscosity, hardness, and thermal conductivity.

The non-curable metal-polyorganosiloxane composition and the cured composite independently have improved thermal stability during thermal aging thereof. Thermal stability of the non-curable metal-polyorganosiloxane composition or cured composite may be shown by comparing a heat-effective characteristic thereof to the same heat-effective characteristic of the respective thermally-aged material, wherein the characteristic is measured according to a suitable test method. The lesser the difference in that characteristic of the thermally-aged material relative to that same characteristic of the non-curable metal-polyorganosiloxane composition or cured composite, respectively, the greater the thermal stability of the non-curable metal-polyorganosiloxane composition or cured composite.

For example, thermal stability of the cured composite may be characterized by an extent of change, if any, in its dynamic viscosity and/or durometer hardness when heated and measured according to a suitable test method. In each test method, the thermal aging may comprise heating test samples of the cured composite in air and at 50% relative humidity (RH) at 150° C. for a period of from 1 day to 42 days. The values measured with the cured composite before heating may be called the "Day 0" value and the values measured with the resulting thermally-aged composite may be called the "Day N" values, wherein Day N is the total number of days of heating (thermal aging). In some aspects Day N is 1 day (i.e., 24 hours), alternatively 3 days, alternatively 5 days, alternatively 7 days, alternatively 14 days, alternatively 21 days, alternatively 28 days, alternatively 35 days, alternatively 42 days. In some aspects Day N is any one of the immediately preceding Day N value at which the maximum extent of change in dynamic viscosity or durometer is observed. The thermal stability of the cured composite shows the inventiveness of the cured composite, and thus also the inventiveness of the metal-polyorganosiloxane mixture and composition used to prepare the cured composite and the inventiveness of the thermally-aged composite prepared from the cured composite.

Alternatively or additionally, thermal stability of the cured composite may be characterized by an extent of change, if any, in its durometer, measured as Shore A hardness following Durometer Hardness Test Method 1 described later, wherein the Shore A hardness of the cured composite before heating (Day 0) is compared to the Shore A hardness after heating at 150° C. for a period of 28 days (Day 28) to give the thermally-aged composite. The lesser extent of increase of durometer (Shore A) during thermal aging, the greater the thermal stability of the cured composite. In some aspects the thermally-aged composite at Day 28 has a durometer (Shore A) that is from >1 to <5 times, alternatively from >1 to <4.5 times, alternatively from >1 to <2 times the durometer (Shore A) of the cured composite at Day 0. In some aspects the thermally-aged composite at Day 28 has a durometer that is from >1 to 50 Shore A greater than, alternatively from 5 to 49 Shore A greater than, alternatively from 5 to 15 Shore A greater than the durometer of the cured composite at Day 0.

The thermal stability of the non-curable metal-polyorganosiloxane composition may be characterized by an extent of change, if any, in its dynamic viscosity, measured in pascal-seconds (Pa-s) at 0.1% strain and 25° C. following Dynamic Viscosity Test Method 1 described later, wherein the dynamic viscosity of the non-curable metal-polyorganosiloxane composition before heating (Day 0) is compared to the dynamic viscosity after heating at 150° C. for a period of 28 days (Day 28) to give the thermally-aged non-curable composition. The lesser an extent of increase of dynamic viscosity during thermal aging, the greater the thermal stability of the non-curable metal-polyorganosiloxane composition. In some aspects the thermally-aged non-curable composition at Day 28 has a dynamic viscosity at 0.1% strain at 25° C. that is from >1 to <2 times, alternatively from >1 to <1.9 times, alternatively from >1 to <1.7 times the dynamic viscosity of the non-curable metal-polyorganosiloxane composition at Day 0. In some aspects the thermally-aged non-curable composition at Day 28 has a dynamic viscosity at 0.1% strain at 25° C. that is from >0 to 1,000 Pa-s greater than, alternatively from 0 to 900 Pa-s greater than, alternatively from 100 to 800 Pa-s greater than the dynamic viscosity of the non-curable metal-polyorganosiloxane composition at Day 0.

The metal-polyorganosiloxane materials provide a technical solution to the problem of thermal instability of incumbent thermally conductive materials by providing improved thermal stability. For example, the metal-polyorganosiloxane materials have, during thermal aging, decreased change in viscosity at 0.1% strain or decreased change in Shore A hardness. The technical solution comprises a combination of features including avoiding condensation curable organosiloxanes, which in turn enables in situ formation of hydrocarbylene-based multipodal silanoxy-functionalized metal particles without bonding of the metal particles to the polyorganosiloxane (or other matrix material) in the metal-polyorganosiloxane material. Typically, the in situ formation of hydrocarbylene-based multipodal silanoxy-functionalized metal particles also proceeds without bonding of the metal particles to each other. Instead the hydrocarbylene-based multipodal silanoxy-functionalized metal particles may be thought of as "free floating" in, and not bonded to, the polyorganosiloxane whether the polyorganosiloxane is non-curable, addition curable, or addition cured. The hydrocarbylene-based multipodal silanoxy-functionalized metal particles are not locked into (not bonded to) a matrix susceptible to thermal expansion/contraction. The improvement, or extent of improvement, in viscosity stability and/or hardness stability in thermally-aged material is useful for applications involving heat or thermal cycling. Electronic devices that contain the thermally-aged material and experience thermal cycling marked by heating and cooling cycles (e.g., on/off cycles) may achieve improved or enhanced performance and/or lifetimes. The improvement, or extent of improvement, in viscosity stability and/or hardness stability in thermally-aged material is/are unpredictable. It is counterintuitive that using a more reactive silane (i.e., constituent (B)) in the metal-polyorganosiloxane composition leads to an increase in stability relative to a non-invention comparative composition that uses a monosilane due to possibilities for additional reactions that could have occurred at higher temperatures in the former relative to the latter.

Accordingly, we believe that the metal-polyorganosiloxane materials provide an improvement in at least one of the following modes of heat failure relative to incumbent thermally conductive materials. The at least one mode includes thermal expansion/stress leading to debonding or delamination (e.g., due to lack or loss of flexibility, cohesiveness or adhesiveness), material fatigue such as embrittlement or cracking (e.g., due to hardening), thermal shock defects such as scribing or phase separation, outgassing of trapped materials leading to corrosion and/or voiding (e.g., during hardening), and migration of contaminants to TIM surfaces.

Some embodiments of the invention include the following numbered aspects.

Aspect 1. A metal-polyorganosiloxane mixture that is free of condensation-curable polyorganosiloxane and solid particles other than metal particles and ceramic particles, the metal-organosiloxane mixture otherwise comprising constituents (A) to (C): (A) a polyorganosiloxane that is free of silicon-bonded organoheteryl groups; (B) a hydrocarbylene-based multipodal silane, and (C) metal particles. The (A) polyorganosiloxane that is free of silicon-bonded organoheteryl groups may be generally referred to herein as "the (A) polyorganosiloxane". The (A) polyorganosiloxane is not moisture curable and not condensation curable with the (B) hydrocarbylene-based multipodal silane or with the (C) metal particles. The (A) polyorganosiloxane is either non-curable or addition curable. The addition curable may comprise radical curable or hydrosilylation curable. The hydrosilylation-curable (A) polyorganosiloxane and the radical-curable (A) polyorganosiloxane may be the same or different. Both the hydrosilylation-curable (A) polyorganosiloxane and the radical-curable (A) polyorganosiloxane independently comprise aliphatically-unsaturated organic groups such as alkynyl groups or, typically, alkenyl groups (e.g., vinyl, 1-propen-1-yl, 1-propen-3-yl, 1-buten-1-yl, 1-buten-4-yl, and 2-buten-1-yl). The radical-curable (A) polyorganosiloxane cures by forming carbon-carbon bonds between different aliphatically unsaturated groups once a radical curing reaction is initiated. Radical curing of the radical-curable (A) polyorganosiloxane may be initiated by any suitable means such as by generating initial radicals by contacting some of the aliphatically unsaturated organic groups of the radical-curable (A) polyorganosiloxane with ultraviolet light and/or a radical initiator, e.g., a peroxide. The hydrosilylation-curable (A) polyorganosiloxane optionally may further comprise silicon-bonded hydrogen atoms (SiH groups). Typically, the hydrosilylation-curable (A) polyorganosiloxane is free of SiH groups, and instead the SiH groups are introduced as part of an additional cross-linker constituent such as a SiH-functional organosiloxane. Typically, a hydrosilylation catalyst (e.g., a Pt-based hydrosilylation catalyst) is also used for hydrosilylation curing. Hydrosilylation curing of the hydrosilylation-curable (A) polyorganosiloxane comprises an addition of Si—H across the unsaturated groups of the aliphatically unsaturated organic groups. Non-curable (A) polyorganosiloxane is free of curable groups, including being free of organoheteryl groups, SiH groups, Si-halogen groups, and aliphatically unsaturated groups. The metal-polyorganosiloxane mixture is a simple mixture in that the constituents (A), (B) and (C) are distinct ingredients such that there are substantially no Si—O—Si bonds between constituents (A) and (B) and there are substantially no Si—O-Metal bonds between constituents (A) and (C) or between constituents (B) and (C). In some aspects the surfaces of (C) metal particles could have a metal oxide layer or a metal nitride layer. When the surfaces of (C) metal particles have a metal oxide layer, the metal of the metal oxide may be the same as, alternatively different than the metal of the underlying core. When the surfaces of (C) metal particles have a metal nitride layer, the metal of the metal nitride may be the same as, alternatively different than the metal of the underlying core.

Aspect 2. The metal-polyorganosiloxane mixture of aspect 1: wherein the constituent (A) is a non-curable polyorganosiloxane that is free of curable groups; or wherein the constituent (A) is an addition-curable polyorganosiloxane containing an average, per molecule, of at least 1 aliphatically unsaturated organic group; or wherein the constituent (A) is the addition-curable polyorganosiloxane that is a radical-curable polyorganosiloxane or a hydrosilylation-curable polyorganosiloxane; or wherein the constituent (A) is the radical-curable polyorganosiloxane that is a thermal radical curable polyorganosiloxane; or wherein the constituent (A) is the hydrosilylation-curable polyorganosiloxane; or wherein the constituent (A) is at least one polyorganosiloxane of formula (I): $[R^1{}_3SiO_{1/2}]_m[R^2{}_2SiO_{2/2}]_d[R^3SiO_{3/2}]_t[SiO_{4/2}]_q[Z]_z$ (I), wherein subscript m is a mole fraction from 0.0025 to 0.05; subscript d is a mole fraction from >0.90 to 0.9975; subscript t is a mole fraction from 0.00 to 0.05; subscript q is a mole fraction from 0.00 to 0.05; subscript z is from 0.00 to 0.05; the sum of m+d+t+q+z=1; each $R^1$ is independently hydrogen, $(C_1-C_6)$alkyl, $(C_2-C_6)$alkenyl, or $(C_2-C_6)$alkynyl; each $R^2$ is independently hydrogen, $(C_1-C_6)$alkyl, $(C_2-C_6)$alkenyl, or $(C_6-C_{10})$aryl; each $R^3$, when present, is independently hydrogen, $(C_1-C_6)$alkyl, $(C_2-C_6)$alkenyl, or $(C_6-C_{10})$aryl; and each Z, when present, is independently a hydrocarbon-diyl, wherein each radical is on a same or different carbon atom of the hydrocarbon-diyl and is bonded to a different silicon atom of the polyorganosiloxane of formula (I). In some aspects, any of the polyorganosiloxanes may be characterized by a silicon-bonded hydroxyl content that is low enough as to not enable appreciable condensation curing thereof. SiOH content may not be intentionally added. In some aspects of formula (I), each $[R^1{}_3SiO_{1/2}]$ unit (a so-called M-type unit) is independently selected from [(($C_1$-$C_2$)alkyl)$_3SiO_{1/2}$], [(($C_1$-$C_2$)alkyl)$_2$(CH2=CH)$SiO_{1/2}$], [(($C_1$-$C_2$)alkyl)$_2$(H)$SiO_{1/2}$], and [(($C_1$-$C_2$)alkoxy)$_3SiO_{1/2}$]. Alternatively or additionally, in some aspects of formula (I), each $[R^2{}_2SiO_{2/2}]$ unit (a D-type unit) is independently selected from [(($C_1$-$C_2$)alkyl)$_2SiO_{2/2}$], [(($C_1$-$C_2$)alkyl)(phenyl)$SiO_{2/2}$], and [(($C_1$-$C_2$)alkyl)(H)$SiO_{2/2}$]. Alternatively or additionally, in some aspects of formula (I), each $[R^3SiO_{3/2}]$ unit (a T-type unit), when present, is independently selected from [($C_1$-$C_2$)alkyl$SiO_{3/2}$], [phenyl$SiO_{3/2}$], and [H$SiO_{3/2}$].

Aspect 3. The metal-polyorganosiloxane mixture of aspect 1 or 2 wherein constituent (B) the hydrocarbylene-based multipodal silane is a hydrocarbylene-based dipodal silane of formula (II): $X_3Si—Y^1—SiX_3$ (II); or a hydrocarbylene-based tripodal silane of formula (III) $X_3Si—Y^2(SiX_3)—SiX_3$ (III); wherein $Y^1$ is a $(C_2-C_{30})$hydrocarbon-diyl; $Y^2$ is a $(C_2-C_{30})$hydrocarbon-triyl; each X is independently a monovalent leaving group selected from halogen, $(C_1-C_6)$alkoxy, $(C_2-C_6)$carboxy, and $(C_2-C_6)$oximo; and wherein each silicon atom in formula (II) is bonded to a same or different carbon atom in $Y^1$ and each silicon atom in formula (III) is independently bonded to a same or different carbon atom in $Y^2$. In some aspects the hydrocarbylene-based dipodal silane is of formula (II). In some aspects the hydrocarbylene-based dipodal silane is of formula (II) wherein $Y^1$ is a $(C_{20}-C_{30})$hydrocarbon-diyl, alternatively $(C_{10}-C_{20})$hydrocarbon-diyl, alternatively $(C_2-C_{12})$hydrocarbon-diyl, alternatively $(C_2-C_{10})$hydrocarbon-diyl, alternatively $(C_2-C_6)$hydrocarbon-diyl, alternatively $(C_2)$hydrocarbon-diyl, alternatively $(C_3)$hydrocarbon-diyl, alternatively $(C_4)$hydrocarbon-diyl, alternatively $(C_5)$hydrocarbon-diyl, alternatively $(C_6)$hydrocarbon-diyl, alternatively $(C_7)$hydrocarbon-diyl, alternatively $(C_8)$hydrocarbon-diyl, alternatively $(C_9)$hydrocarbon-diyl, alternatively $(C_{10})$hydrocarbon-diyl, alternatively $(C_{11})$hydrocarbon-diyl, alternatively $(C_{12})$hydrocarbon-diyl. In some aspects, each $(C_2-C_{30})$hydrocarbon-diyl is unsubstituted. In other aspects, at least one of $(C_2-C_{30})$hydrocarbon-diyl is substituted with at least one substituent, SUB. SUB is as defined later. In some aspects the hydrocarbylene-based dipodal silane is of formula (III). In some aspects the hydrocarbylene-based dipodal silane is of formula (III) wherein $Y^1$ is a $(C_{20}-C_{30})$ hydrocarbon-triyl, alternatively $(C_{10}-C_{20})$hydrocarbon-triyl, alternatively $(C_2-C_{12})$hydrocarbon-triyl, alternatively $(C_2-C_{10})$hydrocarbon-triyl, alternatively $(C_2-C_6)$hydrocarbon-triyl, alternatively $(C_3-C_{12})$hydrocarbon-triyl, alternatively $(C_3-C_{10})$hydrocarbon-triyl, alternatively $(C_3-C_6)$hydrocarbon-triyl, alternatively $(C_2)$hydrocarbon-triyl, alternatively $(C_3)$hydrocarbon-triyl, alternatively $(C_4)$hydrocarbon-triyl, alternatively $(C_5)$hydrocarbon-triyl, alternatively $(C_6)$hydrocarbon-triyl, alternatively $(C_7)$hydrocarbon-triyl, alternatively $(C_8)$hydrocarbon-triyl, alternatively $(C_9)$hydrocarbon-triyl, alternatively $(C_{10})$hydrocarbon-triyl, alternatively $(C_{11})$hydrocarbon-triyl, alternatively $(C_{12})$hydrocarbon-triyl. In some aspects, each $(C_2-C_{30})$hydrocarbon-triyl is unsubstituted. In other aspects, at least one $(C_2-C_{30})$hydrocarbon-triyl is substituted with at least one substituent, SUB. SUB is as defined later. In some aspects of formula (II) or (III) at least one, alternatively each X is independently a monovalent leaving group selected from halogen, $(C_1-C_6)$alkoxy, and $(C_2-C_6)$carboxy. In some aspects at least one, alternatively each X is independently a monovalent leaving group selected from halogen, $(C_1-C_6)$alkoxy, and $(C_2-C_6)$oximo. In some aspects at least one, alternatively each X is independently a monovalent leaving group selected from halogen, $(C_2-C_6)$carboxy, and $(C_2-C_6)$oximo. In some aspects at least one, alternatively each X is independently a monovalent leaving group selected from $(C_1-C_6)$alkoxy, $(C_2-C_6)$carboxy, and $(C_2-C_6)$oximo. In some aspects at least one, alternatively each X is independently a monovalent leaving group selected from halogen, alternatively $(C_1-C_6)$alkoxy, alternatively $(C_2-C_6)$carboxy, alternatively $(C_2-C_6)$ oximo. In some aspects at least one, alternatively each X is independently a halogen, wherein at least one, alternatively each halogen is Cl. In some aspects at least one, alternatively each X is independently a ($C_1$-$C_6$)alkoxy, wherein at least one, alternatively each ($C_1$-$C_6$)alkoxy is ($C_1$-$C_3$)alkoxy, ($C_3$-$C_6$)alkoxy, ($C_4$-$C_6$)alkoxy, methoxy, ethoxy, a ($C_3$) alkoxy, a ($C_4$)alkoxy, a ($C_5$)alkoxy, or a ($C_6$)alkoxy. In some aspects at least one, alternatively each X is independently a ($C_2$-$C_6$)carboxy, wherein at least one, alternatively each ($C_2$-$C_6$)carboxy is a ($C_2$-$C_3$)carboxy, a ($C_3$-$C_6$)carboxy, a ($C_4$-$C_6$)carboxy, acetoxy (i.e., $CH_3C(O)O$—), a ($C_3$)carboxy, a ($C_4$)carboxy, a ($C_5$)carboxy, or a ($C_6$)carboxy. In some aspects at least one, alternatively each X is independently a ($C_2$-$C_6$)oximo, wherein at least one, alternatively each ($C_2$-$C_6$)oximo is a ($C_2$-$C_3$)oximo, a ($C_3$-$C_6$)oximo, a ($C_4$-$C_6$)oximo, acetaldehydeoximo (i.e., $CH_3C=NO$—), a ($C_3$)oximo, a ($C_4$)oximo, a ($C_5$)oximo, or a ($C_6$)oximo.

Aspect 4. The metal-polyorganosiloxane mixture of any one of aspects 1-3, wherein constituent (B) the hydrocarbylene-based multipodal silane is any one of (i) to (xviii): (i) the hydrocarbylene-based dipodal silane of formula (II): $X_3Si$—$Y^1$—$SiX_3$ (II); (ii) the hydrocarbylene-based tripodal silane of formula (III) $X_3Si$—$Y^2(SiX_3)$—$SiX_3$ (III); (iii) a 1,2'-bis(tri(($C_1$-$C_6$)alkoxy)silyl)ethyl-benzene; (iv) a bis(tri(($C_1$-$C_6$)alkoxy)silyl)($C_1$-$C_{12}$)alkane; (v) a bis(tri(($C_1$-$C_6$)alkoxy)silyl)($C_2$-$C_{12}$)alkane; (vi) a 1,2-bis(tri(($C_1$-$C_6$)alkoxy)silyl)($C_2$-$C_{12}$)alkane; (vii) a 1,2-bis(tri(($C_1$-$C_6$)alkoxy)silyl)ethane; (viii) a 1,2-bis(tri(($C_1$-$C_6$)alkoxy)silyl) propane; (ix) a 1,2-bis(tri(($C_1$-$C_6$)alkoxy)silyl)butane; (x) a 1,2-bis(tri(($C_1$-$C_6$)alkoxy)silyl)pentane; (xi) a 1,2-bis(tri(($C_1$-$C_6$)alkoxy)silyl)hexane; (xii) a 1,2-bis(tri(($C_1$-$C_6$) alkoxy)silyl)heptane; (xiii) a 1,2-bis(tri(($C_1$-$C_6$)alkoxy)silyl)octane; (xiv) a 1,2-bis(tri(($C_1$-$C_6$)alkoxy)silyl)nonane; (xv) a 1,2-bis(tri(($C_1$-$C_6$)alkoxy)silyl)decane; (xvi) a 1,2-bis (tri(($C_1$-$C_6$)alkoxy)silyl)undecane; (xvii) a 1,2-bis(tri(($C_1$-$C_6$)alkoxy)silyl)dodecane; (xviii) a 1,3-substituted regioisomer of any one of (vi) to (xvii); and (xix) any one of (i) to (xviii) wherein each ($C_1$-$C_6$)alkoxy independently is methoxy or ethoxy.

Aspect 5. The metal-polyorganosiloxane mixture of any one of aspects 1-4 wherein the constituent (C) the metal particles comprise or consist essentially of aluminum, wherein the aluminum particles have an average particle size of greater than 1 micrometer; beryllium; bismuth; cobalt; copper; gold; indium; iron; nickel; palladium; platinum; silver; tin; titanium; zinc; an alloy of any two of aluminum, beryllium; bismuth, cobalt, copper, gold, indium, iron, nickel, palladium, platinum, silver, tin, titanium, and zinc; or wherein the constituent (C) the metal particles comprise or consist essentially of core-shell metal particles wherein the shell comprises or consists essentially of aluminum, beryllium, bismuth, cobalt, copper, gold, indium, iron, nickel, palladium, platinum, silver, tin, titanium, or zinc; and the core comprises or consists essentially of a support material. In some aspects the constituent (C) metal particles comprise or consist essentially of a low melting point metal such as Ag, Au, Bi, Cd, Cu, In, Pb, Sb, Sn, Ga, Zn, or an alloy or combination of any two or more thereof.

In some aspects the metal of the metal particles, the metal of the shell of the core-shell metal particles, and/or the support material of the core of the core-shell metal particles independently comprises or consists essentially of aluminum; bismuth; cobalt; copper; gold; indium; iron; nickel; palladium; platinum; silver; tin; titanium; zinc; or an alloy of any two or more thereof. In some aspects the metal of the metal particles, the metal of the shell of the core-shell metal particles, and/or the support material of the core of the core-shell metal particles independently comprises or consists essentially of Bi, In, Sn, Ga, or an alloy of any two or more thereof; alternatively of Ag, Au, Cd, Cu, Pb, Sb, Zn, or a combination of any two or more thereof. The alloy may comprises an In—Bi—Sn alloy, Sn—In—Zn alloy, Sn—In—Ag alloy, Sn—Ag—Bi alloy, Sn—Bi—Cu—Ag alloy, Sn—Ag—Cu—Sb alloy, Sn—Ag—Cu alloy, Sn—Ag alloy, Sn—Ag—Cu—Zn alloy, or a combination of any two or more thereof. In some aspects the metal of the metal particles, the metal of the shell of the core-shell metal particles, and/or the support material of the core of the core-shell metal particles independently comprises or consists essentially of aluminum; bismuth; cobalt; gold; indium; iron; palladium; platinum; silver; tin; titanium; zinc; or an alloy of any two or more thereof. In some aspects the metal of the metal particles, the metal of the shell of the core-shell metal particles, and/or the support material of the core of the core-shell metal particles independently comprises or consists essentially of aluminum; cobalt; copper; gold; iron; nickel; silver; tin; titanium; zinc; or an alloy of any two or more thereof. In some aspects the metal of the metal particles, the metal of the shell of the core-shell metal particles, and/or the support material of the core of the core-shell metal particles independently comprises or consists essentially of aluminum; alternatively bismuth; alternatively cobalt; alternatively copper; alternatively gold; alternatively indium; alternatively iron; alternatively nickel; alternatively palladium; alternatively platinum; alternatively silver; alternatively tin; alternatively titanium; alternatively zinc; alternatively an alloy of any two or more thereof.

In other aspects the support material of the core-shell metal particles independently is a non-metal selected from a silicate glass, ceramic, or carbon particle. In some aspects the support material is the carbon particle and the carbon particle comprises carbon blacks, carbon nanotubes, powdered diamond, powdered graphite, or graphene. In some aspects the support material is the silicate glass and the silicate glass comprises a fused quartz (fused silica glass or vitreous silica glass), soda-lime-silica glass, sodium borosilicate glass, lead-oxide glass, aluminosilicate glass, or oxide glass (alumina and germanium oxide). In some aspects the support material is a solid, alternatively a liquid. In some aspects the support material is a hollow particle, alternatively a non-hollow particle. In some aspects the support material is porous, alternatively non-porous. In some aspects the support material is a solid, alternatively a liquid. In some aspects the (C) metal particles include core-shell particles having a metal core and a shell of silver, e.g., silver-coated aluminum particles, silver-coated nickel particles, silver coated copper particles, or a combination of any two or more thereof.

In some aspects the (C) metal particles are hollow, alternatively non-hollow. In some aspects the (C) metal particles are porous, alternatively non-porous. In some aspects the (C) metal particles are of regular shape, alternatively irregular shape. In some aspects the regular shape of the metal particles is a spherical, cubic, rhombic, ovoid, or lamellar. In some aspects the (C) metal particles have an average particle size of from 0.1 to 100 micrometers (μm), alternatively from 0.2 to 50 μm, alternatively from 0.4 to 20 μm. In some aspects the (C) metal particles have an average particle size distribution characterized as a monomodal distribution, alternatively a multimodal distribution. The monomodal distribution of average particle size means a single size grade of (C) metal particles is used. The multimodal distribution of average particle size means a combination of two or more different size grades of (C) metal particles is used.

For example, in some aspects the multimodal distribution is a bimodal distribution of average particle size comprising a first size grade of (C) metal particles having an average particle size of 2 µm and a second size grade of (C) metal particles having an average particle size of 9 µm. In another example, the multimodal distribution is a trimodal distribution of average particle size comprising a third size grade of (C) metal particles having an average particle size of 0.4 µm, the second size grade of (C) metal particles having an average particle size of 2 µm, and the first size grade of (C) metal particles having an average particle size of 9 µm. The metals of (C) metal particles that comprise the combination of two or more different size grades of (C) metal particles used in the multimodal particle size distribution may be the same or different. In some aspects the first, second and third size grades of (C) metal particles are all aluminum particles; alternatively two of the size grades are aluminum particles and the other of the size grades is silver or titanium particles. As used herein, "size grade" means a batch of (C) metal particles having a known monomodal particle size distribution. The size grades may be commercially supplied.

Aspect 6. The metal-polyorganosiloxane mixture of any one of aspects 1-5 further comprising constituent (D) ceramic particles. In some aspects the (D) ceramic particles are hollow, alternatively non-hollow. In some aspects the (D) ceramic particles are porous, alternatively non-porous. In some aspects the (D) ceramic particles are of regular shape, alternatively irregular shape. In some aspects the regular shape of the metal particles is a spherical, cubic, rhombic, ovoid, or lamellar. In some aspects the (D) ceramic particles have an average particle size of from 0.05 to 1.0 µm, alternatively from 0.09 to 0.6 µm, alternatively from 0.1 to 0.4 µm. In some aspects the (D) ceramic particles have a particle size distribution characterized as a monomodal distribution, alternatively a bimodal distribution.

Aspect 7. The metal-polyorganosiloxane mixture of aspect 6 wherein the (D) ceramic particles have an average particle size of from 0.1 micrometer to less than 1 micrometer and/or wherein the ceramic particles comprise or consist essentially of zinc oxide, alumina, or a combination of zinc oxide and alumina. In some aspects the ceramic particles comprise or consist essentially of zinc oxide, alternatively alumina, alternatively the combination of zinc oxide and alumina. Alternatively, the (D) ceramic particles may comprise or consist essentially of a nitride such as an aluminum nitride or boron nitride; a metal oxide such as aluminum oxide, beryllium oxide, copper oxide, magnesium oxide, nickel oxide, silver oxide, zinc oxide, or a combination of any two or more thereof; a metal hydroxide such as aluminum trihydrate or magnesium hydroxide; onyx, a metal carbide such as silicon carbide or tungsten carbide; or a metal titanate such as barium titanate. The (D) ceramic particles differ from the (C) metal particles, including the metal particles having a metal oxide or metal nitride surface layer or support material in at least one feature, structure, function, reactivity or property. For example, the (C) metal particles contain elemental metal (formal oxidation state 0), whereas the (D) ceramic particles do not contain elemental metal.

Aspect 8. The metal-polyorganosiloxane mixture of any one of aspects 1-7 further comprising at least one of optional constituents (E) to (V): (E) a crosslinker, which is reactive with constituent (A) for forming a crosslinking group between two or more molecules of constituent (A); (F) a cure catalyst, which is reactive for catalyzing a crosslinking reaction between a molecule of constituent (E) and two or more molecules of constituent (A); (G) a catalyst inhibitor, which is effective at 23 degrees Celsius for inhibiting curing catalyzed by constituent (F); (H) an adhesion promoter; (I) a rheology modifier; (J) an antioxidant; (K) a thixotropic agent; (L) a colorant; (M) a coupling initiator, which is effective for initiating a condensation reaction between constituent (B) and constituent (C); (N) a vehicle selected from a solvent, a diluent, and a dispersant; (O) a reactive diluent; (P) an acid acceptor; (Q) a corrosion inhibitor; (R) a radical cure initiator, which is effective for initiating a radical addition reaction between two or more molecules of constituent (A) wherein constituent (A) is an addition-curable polyorganosiloxane containing an average, per molecule, of at least 1 aliphatically unsaturated organic group; (S) a chain extender; (T) a treating agent; and (U) a reactive compound. In some aspects the metal-polyorganosiloxane mixture does not further comprise any of constituents (E) to (U). In other aspects the metal-polyorganosiloxane mixture further comprises at least one, alternatively at least two, alternatively at least three of constituents (E) to (U). In some aspects the metal-polyorganosiloxane mixture further comprises (E) the crosslinker; alternatively (F) the cure catalyst; alternatively (G) the catalyst inhibitor; alternatively (H) the adhesion promoter; alternatively (I) the rheology modifier; alternatively (J) the antioxidant; alternatively (K) the thixotropic agent; alternatively (L) the colorant; alternatively (M) the coupling initiator; alternatively (N) the vehicle; alternatively (O) the reactive diluent; alternatively (P) the acid acceptor; alternatively (Q) the corrosion inhibitor; alternatively (R) the radical cure initiator; alternatively (S) the chain extender; alternatively (T) the treating agent; alternatively (U) the reactive compound. In some aspects the metal-polyorganosiloxane mixture further comprises constituent (E) and any one of constituents (F) to (U); alternatively constituent (F) and any one of constituents (E) and (G) to (U); alternatively constituent (G) and any one of constituents (E), (F) and (H) to (U); alternatively constituent (H) and any one of constituents (E) to (G) and (I) to (U); alternatively constituent (I) and any one of constituents (E) to (H) and (J) to (U); alternatively constituent (J) and any one of constituents (E) to (I) and (K) to (U); alternatively constituent (K) and any one of constituents (E) to (J) and (L) to (U); alternatively constituent (L) and any one of constituents (E) to (K) and (M) to (U); alternatively constituent (M) and any one of constituents (E) to (L) and (N) to (U); alternatively constituent (N) and any one of constituents (E) to (M) and (O) to (U); alternatively constituent (O) and any one of constituents (E) to (N) and (P) to (U); alternatively constituent (P) and any one of constituents (E) to (O) and (Q) to (U); alternatively constituent (Q) and any one of constituents (E) to (P) and (R) to (U); alternatively constituent (R) and any one of constituents (E) to (Q) and (S) to (U); alternatively constituent (S) and any one of constituents (E) to (R), (T) and (U); alternatively constituent (T) and any one of constituents (E) to (S), and (U); alternatively constituent (U) and any one of constituents (E) to (T). In some aspects the metal-polyorganosiloxane mixture further comprises constituents (E) and (F); alternatively constituents (F) and (G); alternatively the constituents (E), (F), and (G); alternatively the constituents (E) and (H); alternatively the constituents (E) and (I); alternatively constituent (J) and any one of constituents (E) to (I) and (K) to (R); alternatively constituents (E) and (N); alternatively constituents (E), (F), and (N); alternatively any one of the immediately foregoing aspects and constituent (S) chain extender. In some aspects the metal-polyorganosiloxane mixture further comprises constituent (U) reactive compound.

Aspect 9. The metal-polyorganosiloxane mixture of any one of aspects 1-8: Wherein the metal-polyorganosiloxane mixture is characterized by amounts of its constituents (A) to (C) plus any optional constituents, wherein the amount of the constituent (C) metal particles is from 40 to 95 weight percent of the metal-polyorganosiloxane mixture, the amount of constituent (B) the hydrocarbylene-based multipodal silane is from 0.01 to 2 weight percent of the metal-polyorganosiloxane mixture, and the sum of the amount of constituent (A) plus the amount(s) of any optional constituent(s) is from 3 to 58 weight percent of the metal-polyorganosiloxane mixture; all based on a total of 100 weight percent of the metal-polyorganosiloxane mixture; or Wherein the metal-polyorganosiloxane mixture further comprises constituent (D) ceramic particles and the metal-polyorganosiloxane mixture is characterized by amounts of its constituents (A) to (D) plus any optional constituents, wherein the amount of the (C) metal particles is from 15 to 90 weight percent of the metal-polyorganosiloxane mixture, the amount of the (D) ceramic particles is from 5 to 25 weight percent of the metal-polyorganosiloxane mixture, the amount of (B) the hydrocarbylene-based multipodal silane is from 0.01 to 2 weight percent of the metal-polyorganosiloxane mixture, and the sum of the amount of constituent (A) plus the amount(s) of any constituent(s) other than constituents (A) to (D) is from 3 to 58 weight percent of the metal-polyorganosiloxane mixture; all based on a total of 100 weight percent of the metal-polyorganosiloxane mixture.

Aspect 10. A method of making a metal-polyorganosiloxane mixture that is free of condensation-curable polyorganosiloxane and solid particles other than metal particles and ceramic particles, the metal-organosiloxane mixture otherwise comprising constituents (A) to (C): (A) a polyorganosiloxane that is free of silicon-bonded organoheteryl groups; (B) a hydrocarbylene-based multipodal silane, and (C) metal particles, the method comprising mixing constituents (A), (B), and (C) together so as to make the metal-polyorganosiloxane mixture. In some aspects the mixing may comprise mixing (A) and (B) together to give a first mixture of (A) and (B), and then adding (C) to the first mixture to give the metal-polyorganosiloxane mixture. Alternatively, the mixing may comprise mixing (A) and (C) together to give a second mixture of (A) and (C), and then adding (B) to the second mixture to give the metal-polyorganosiloxane mixture. In some aspects the mixing does not comprise mixing (B) and (C) together in the absence of (A). In aspects wherein the metal-polyorganosiloxane mixture further comprises (D) ceramic particles, the mixing may comprise blending (C) and (D) together to give a blend of (C) and (D), and then adding the blend to the first mixture of (A) and (B) to give the metal-polyorganosiloxane mixture further comprising (D). Alternatively, the mixing may comprise mixing (A) and the blend together to give a third mixture of (A) and the blend of (C) and (D), and then adding (B) to the third mixture to give the metal-polyorganosiloxane mixture further comprising (D). In aspects wherein the metal-polyorganosiloxane mixture further comprises at least one of constituents (E) to (U), the at least one of constituents (E) to (U) may be mixed with (A) to give a fourth mixture of (A) and the at least one of (E) to (U), alternatively the at least one of constituents (E) to (U) may be mixed with the first mixture of (A) and (B) to give a fifth mixture of (A), (B) and the at least one of (E) to (U), alternatively the at least one of constituents (E) to (U) may be mixed with the second mixture of (A) and (C) to give a sixth mixture of (A), (C) and the at least one of (E) to (U). Thereafter, (B) may be added to the fourth mixture or to the sixth mixture to give the metal-polyorganosiloxane mixture further comprising at least one of constituents (E) to (U). Alternatively, (C) may be added to the fifth mixture to give the metal-polyorganosiloxane mixture further comprising at least one of constituents (E) to (U). Other ways of mixing the at least one of constituents (E) to (U) to give the metal-polyorganosiloxane mixture further comprising at least one of constituents (E) to (U) are contemplated. The blending and mixing may be performed in a mixer or blender. If desired, in view of heats of mixing, the temperature of the constituents being mixed may be controlled by any suitable means such as using a cooling bath and/or pre-cooled constituents such that the temperature during mixing remains below a predetermined value (e.g., <50° C.). In this way the temperature may be prevented from reaching a value where curing of any curable polyorganosiloxane would begin.

Aspect 11. A metal-polyorganosiloxane composition that is free of condensation-curable polyorganosiloxane and solid particles other than metal particles and ceramic particles, the metal-organosiloxane composition otherwise comprising constituents (A) and (B'-C'): (A) a polyorganosiloxane that is free of silicon-bonded organoheteryl groups; and (B'-C') hydrocarbylene-based multipodal silanoxy-functionalized metal particles. In constituent (B'-C'), each hydrocarbylene-based multipodal silanoxy-functionalized metal particle contains at least one Si—O-Metal bond between the hydrocarbylene-based multipodal silanoxy functional group and the metal particle. The constituent (B'-C') is different than a combination of constituents (B) and (C) in at least one feature, structure, function, reactivity or property. The composition is different than the metal-polyorganosiloxane mixture in at least one feature, structure, function, reactivity or property. Once formed in the presence of (A), hydrocarbylene-based multipodal silanoxy-functionalized metal particles may be characterized in place. Alternatively, if desired, the (B'-C') hydrocarbylene-based multipodal silanoxy-functionalized metal particles may be separated from (A) to give isolated (B'-C') hydrocarbylene-based multipodal silanoxy-functionalized metal particles. The separation may comprise any suitable technique for removing the (B'-C') hydrocarbylene-based multipodal silanoxy-functionalized metal particles from the constituent (A), or vice versa removing the constituent (A) from the (B'-C') hydrocarbylene-based multipodal silanoxy-functionalized metal particles. The separation may comprise centrifugation, chromatography, decantation, distillation, filtration, fractional dissolution, magnetic field manipulation, manual separation, stripping, or a combination of any two or more thereof. For example, the separation may comprise filtering the (B'-C') hydrocarbylene-based multipodal silanoxy-functionalized metal particles from the constituent (A), optionally with the aid of (N) vehicle and/or a filter aid. Alternatively, the separation may comprise stripping constituent (A) from the metal-polyorganosiloxane composition. In some aspects the invention includes the isolated constituent (B'-C') hydrocarbylene-based multipodal silanoxy-functionalized metal particles. Certain separation techniques may be aided by using a (N) vehicle and/or a filter aid. The isolated constituent (B'-C') hydrocarbylene-based multipodal silanoxy-functionalized metal particles are different in at least one feature, structure, function, reactivity or property from that of reference pre-treated metal particles formed by contacting constituents (B) and (C) together in the absence of constituent (A) to give reference pretreated particles. Similarly, the metal-polyorganosiloxane composition is different in at least one feature, structure, function, reactivity or property from a reference composition formed by contacting the reference pretreated particles with constituent (A) to form a reference composition comprising a mixture of the reference pretreated particles in constituent (A).

Aspect 12. The metal-polyorganosiloxane composition of aspect 11 wherein the constituent (A) is a non-curable polyorganosiloxane and the metal-polyorganosiloxane composition is a non-curable metal-polyorganosiloxane composition; wherein the constituent (A) is an addition-curable polyorganosiloxane and the metal-polyorganosiloxane composition is an addition-curable metal-polyorganosiloxane composition; and/or wherein the constituent (B'-C') is dispersed in the constituent (A). Each of the non-curable polyorganosiloxane and the addition-curable polyorganosiloxane is free of silicon-bonded organoheteryl groups.

Aspect 13. A method of making a metal-polyorganosiloxane composition that is free of condensation-curable polyorganosiloxane and solid particles other than metal particles and ceramic particles, the metal-organosiloxane composition otherwise comprising constituents (A) and (B'-C'): (A) a polyorganosiloxane that is free of silicon-bonded organoheteryl groups; and (B'-C') hydrocarbylene-based multipodal silanoxy-functionalized metal particles; the method comprising contacting, under treating conditions, the metal-polyorganosiloxane mixture of any one of aspects 1-9, wherein the multipodal silane has hydrolyzable groups, with a controlled amount of water in the presence of and without curing the polyorganosiloxane that is free of silicon-bonded organoheteryl groups so as to enable a condensation reaction to occur between the constituents (B) and (C) to give the metal-polyorganosiloxane composition, wherein the controlled amount of water is less than stoichiometric relative to the amount of hydrolyzable groups of the multipodal silane.

Aspect 14. A cured composite that is free of condensation-crosslinked polyorganosiloxane and solid particles other than metal particles and ceramic particles, the cured composite otherwise comprising hydrocarbylene-based multipodal silanoxy-functional metal particles dispersed in an addition-cured polyorganosiloxane. The cured composite is different than the composition feature, structure, function, reactivity or property. The cured composite is also different than the metal-polyorganosiloxane mixture in at least one feature, structure, function, reactivity or property.

Aspect 15. The cured composite of aspect 14 characterized by an enhanced stability to thermal aging at a temperature of 150 degrees Celsius (° C.) compared to a reference cured composite that is free of condensation-crosslinked polyorganosiloxane and solid particles other than metal particles and ceramic particles, the reference cured composite otherwise comprising unfunctionalized metal particles dispersed in the same addition-cured polyorganosiloxane. The reference cured composite is made by subjecting to curing conditions a reference composition of a cure catalyst, the polyorganosiloxane, a crosslinker reactive with the polyorganosiloxane, and the metal particles, wherein the reference composition is free of the (B) hydrocarbylene-based multipodal silane and free of any other silane.

Aspect 16. A method of making a cured composite that is free of condensation-crosslinked polyorganosiloxane and solid particles other than metal particles and ceramic particles, the method comprising contacting, under curing conditions, the metal-polyorganosiloxane composition of aspect 12, with constituent (E) a crosslinker reactive with the addition-curable polyorganosiloxane and constituent (F) a cure catalyst so as to enable crosslinking between constituent (E) and constituent (A) to give the cured composite.

Aspect 17. A method of making a thermally-aged material, the method comprising heating the non-curable metal-polyorganosiloxane composition of aspect 12 or the cured composite of aspect 14 or 15 at a temperature from 100° C. to 350° C. for at least 1 day to give the thermally-aged material, which comprises a thermally-aged non-curable composition or a thermally-aged composite, respectively. Alternatively, the thermal aging temperature may from 120° to 300° C., alternatively from 145° to 250° C. The thermal aging time period may be at least 3 days, alternatively at least 5 days, alternatively at least 7 days, alternatively at least 14 days, alternatively at least 21 days, alternatively at least 28 days, alternatively at least 35 days, alternatively at least 42 days. In some aspects the thermal aging time period may be at most 1,000 days, alternatively at most 100 days, alternatively at most 50 days. The heating period may be continuous, alternatively discontinuous (i.e., cumulative). For example, a heating period of 5 days may be a single 5 day period of heating, alternatively an accumulation of two or more separate periods of heating that add up to 5 total days of heating. Each separate period of the accumulation is spaced apart by an independent cooling period wherein the temperature is kept at less than 30° C., such as 23° C. For illustration, an accumulated heating period of 5 days may be composed of five 1 day heating periods each spaced apart by a cooling period of 1 day at 23° C.; or one 1 day heating period and one 4 day heating period spaced apart by a cooling period wherein the material is kept at 0° C. The heating may be performed in ambient atmosphere, alternatively in a controlled atmosphere. The controlled atmosphere may consist essentially of a vacuum condition, an inert gas (e.g., a gas of molecular nitrogen, helium, argon, or a mixture of any two or more thereof), or a redox gas (e.g., gas of carbon dioxide, molecular oxygen, or molecular hydrogen).

Aspect 18. The thermally-aged material prepared by the method of aspect 17. The thermally-aged non-curable composition is different than the non-curable metal-polyorganosiloxane composition in at least one feature, structure, function, reactivity or property. The thermally-aged non-curable composition is also different than the non-curable metal-polyorganosiloxane mixture. The thermally-aged composite is different than the cured composite in at least one feature, structure, function, reactivity or property. The thermally-aged composite is also different than the metal-polyorganosiloxane composition and mixture in at least one feature, structure, function, reactivity or property.

Aspect 19. A manufactured article comprising component (1): a heat conductor component comprising the metal-polyorganosiloxane mixture of any one of aspects 1-9, the metal-polyorganosiloxane composition of aspect 11 or 12, or the cured composite of aspect 14 or 15, or the thermally-aged material of aspect 18.

Aspect 20. The manufactured article of aspect 19, wherein the metal-polyorganosiloxane mixture, the metal-polyorganosiloxane composition, cured composite, and/or thermally-aged material is characterized by a thermal conductivity >0.6 W/m-K measured according to test method ISO 22007-2:2015 as described later. In some aspects the thermal conductivity is at least 1 W/m-K, alternatively 2 W/m-K, alternatively 3 W/m-K. In some aspects the thermal conductivity is at most 20 W/m-K, alternatively 15 W/m-K, alternatively 10 W/m-K. In some aspects the thermal conductivity is from 2 W/m-K to 9 W/m-K.

Aspect 21. An electronic device in need of heat management, the electronic device comprising components (1) to (3): (1) a heat conductor component comprising the metal-polyorganosiloxane mixture of any one of aspects 1-9, the metal-polyorganosiloxane composition of aspect 11 or 12, or the cured composite of aspect 14 or 15, or the thermally-aged material of aspect 18; (2) a heat-generating electronic component; and (3) a heat dissipating component; wherein (A) the heat conductor component is disposed between and in thermal communication with the components (2) and (3) in such a way that at least some of the heat generated by (2) the heat generating component is conducted from (2) the heat generating component through (1) the heat conductor component into (3) the heat dissipating component.

Aspect 22. The electronic device of aspect 21 wherein (1) the heat conductor component comprises the cured composite and/or wherein (1) the heat conductor component comprises the thermally-aged material and/or wherein (3) the heat dissipating component is a heat sink or a heat spreader.

Aspect 23. Use of (1) a heat conductor component comprising the metal-polyorganosiloxane mixture of any one of aspects 1-9, the metal-polyorganosiloxane composition of aspect 11 or 12, or the cured composite of aspect 14 or 15, or the thermally-aged material of aspect 18 in a device in need of heat management.

Aspect 24. The electronic device of aspect 21 or the use of aspect 22 wherein (1) the heat conductor component is used in the device as a thermal adhesive, thermal gel, thermal grease, thermal interface material, or thermal gap filler.

This invention is described herein in an illustrative manner by disclosing a plurality of representative, non-limiting embodiments and examples. The terms used herein may be readily understood by a skilled artisan. Some terms are defined by IUPAC such as, for example, in IUPAC. Compendium of Chemical Terminology, 2nd ed. (the "Gold Book"). Compiled by A. D. McNaught and A. Wilkinson. Blackwell Scientific Publications, Oxford (1997). XML on-line corrected version: http://goldbook.iupac.org (2006-) created by M. Nic, J. Jirat, B. Kosata; updates compiled by A. Jenkins. ISBN 0-9678550-9-8. doi:10.1351/goldbook. Terms not defined by IUPAC may be defined in Hawley's CONDENSED CHEMICAL DICTIONARY, 11th edition, N. Irving Sax & Richard J. Lewis, Sr., 1987 (Van Nostrand Reinhold). Other terms are defined below. Any reference to such terms herein shall default to these definitions unless a different meaning of the term, phrase or expression is stated or indicated from the context of different description elsewhere herein. For example, if a concentration is expressed elsewhere herein as a mole percent, then it is not the default weight percent.

Alternatively shall indicate an independent embodiment. Amount and ratio of amounts is based on weight. Articles "a", "an", and "the" each refer to one or more. Aspect and embodiment are used interchangeably. "Average per molecule" or equivalent expression means a total quantity for/from all molecules divided by the number of molecules.

"By-product" means a secondary product of a chemical reaction.

"Catalyst" means a homogeneous or heterogeneous catalyst, which may be supported or unsupported, and which may or may not be a composite material. "Chemical element" or "atom", a Group or Groups of chemical elements, or a Periodic Table of the Elements shall mean the chemical elements, Group(s), and Periodic Table of the Elements published by IUPAC, version dated 1 May 2013; see iupac.org/reports/periodic_table/). "Coating" is used interchangeably with "film" and means a material that is restricted in one dimension. The restricted dimension may be characterized as "thickness". "Comparative," as in comparative example, is for illustration purposes only and shall not mean something from the prior art. "Composition" means chemical matter that may be defined by an empirical formula of its constituent elements. "Concentration" as a "percent" or "%" means weight percent (wt %) and is based on total weight of all ingredients used to make the material being described, which total weight is 100 wt %. "Contacting" means bringing into physical contact.

"Ene" used as a suffix in a chemical name, such as hydrocarbylene, alkylene, alkenylene, arylene, and phenylene means a divalent radical group. The "ene" names may be used interchangeably with their "diyl" names such as hydrocarbon-diyl, alkane-diyl, alkene-diyl, arene-diyl, benzene-diyl, respectively. "Examples" of the invention may be relied upon and provide adequate support for specific inventive embodiments.

"Formulation, one-part", sometimes called a one-part composition, means a mixture containing all the constituents needed to produce a cured material. The one-part formulation may use external factors such as moisture (for condensation curing), heat (for addition curing), or light (for addition curing) to initiate, speed or complete the curing process. "Formulation, two-part", sometimes called a two-part composition, means a system that segregates different reactive constituents into two separate mixtures to prevent premature initiation of curing. For example, a monomer or prepolymer may comprise a primary part and a solvent and cure catalyst may comprise a secondary part. Initiation of curing is achieved by combining the primary part and the secondary part into a one-part formulation. Although any proportions may be used, the resulting one-part formulation may comprise from 10 to 90 wt % of the primary part and from 90 to 10 wt % of the secondary part. "Free of" is used interchangeably with "lacks" and means not detectable using nuclear magnetic resonance (NMR) spectroscopy (e.g., $^1$H-NMR, $^{13}$C-NMR, or $^{29}$Si-NMR) or Fourier Transform-Infrared (FT-IR) spectroscopy; alternatively a complete absence of.

"Greater than" or ">" encompasses a range or subrange that includes as its upper endpoint the absolute maximum (e.g., 100%) or, as the case may be where there is no absolute maximum, a practical maximum (e.g., 10,000 repeat units or 10,000,000 g/mol. Alternatively, the upper endpoint may be less than the absolute maximum (e.g., <100%) or less than the practical maximum (e.g., <10,000 repeat units or <10,000,000 g/mol).

"Heteroatom" in an organic group that contains same means any atom other than carbon and hydrogen. Typically heteroatoms in organic groups that contain same are selected from N, O, S, and P; alternatively N, O, and S; alternatively N or O. "Heterohydrocarbyl" is a monovalent organic group that, in its unsubstituted form, contains at least one heteroatom and has its formal radical on a carbon atom. "Hydrocarbyl" is a monovalent organic group that, in its unsubstituted form, is composed of carbon and hydrogen atoms only and has its formal radical on a carbon atom.

"Invention" or an equivalent expression (e.g., the present invention, this invention or the invention) shall mean representative inventive embodiments or aspects, and shall not be used to unduly limit inventive scope. "IUPAC" is International Union of Pure and Applied Chemistry (IUPAC Secretariat, Research Triangle Park, N.C., USA).

"Less than" or "<" encompasses a range or subrange that includes as its lower endpoint the absolute minimum (e.g., zero (0)) or, as the case may be where there is no absolute minimum, a practical minimum (e.g., greater than zero (>0). Alternatively, the lower endpoint may be greater than the absolute minimum (e.g., >0%). "Concentration <10 wt %" means from >0 to <10 wt %. Markush group of members A, B, and C may be equivalently expressed as: "a member selected from A, B, and C"; "a member selected from the group consisting of A, B, and C"; or "a member A, B, or C". The Markush group may comprise a genus and a subgenus thereof, a genus and a specific member thereof, or a subgenus and a specific member thereof; each of which may be relied upon individually or collectively. "May" confers a choice, not an imperative. "Molecular mass" of a molecule means molecular weight (MW) expressed in grams per mole. "Average molecular mass" of a polymer means weight average molecular weight ($M_w$) expressed in grams. $M_w$ is determined using gel permeation chromatography (GPC) with polystyrene standards.

"Operative" means functionally effective. E.g., "operative contact" comprises functionally effective touching, e.g., as for modifying, coating, adhering, sealing, or filling. The operative contact may be direct physical touching, alternatively indirect touching, provided it is effective for its intended purpose. "Optionally" means is absent (or excluded), alternatively is present (or included). "Organic group" and "organo group" are used interchangeably and may be unsubstituted or substituted and composed of one or more carbon atoms and hydrogen atoms (when unsubstituted) and, optionally, heteroatoms. An organic group may be monovalent (having one free valence), divalent (having two free valences), trivalent (having three free valences), or tetravalent (having four free valences); also known as univalent, bivalent, trivalent, or quadravalent, respectively. Each formal radical of an organic group independently may be on a carbon atom or, when present, optionally on a heteroatom. "Organoheteryl" is a monovalent organic group that, in its unsubstituted form, has at least one heteroatom and has its formal radical on a heteroatom. "Organyl" is a monovalent organic group that in its unsubstituted form, optionally may or may not contain at least one heteroatom and has its formal radical on a carbon atom.

"Properties" of a material (e.g., viscosity) are measured, by default, using a test method for measuring same conducted at 23 degrees Celsius (° C.) and 101.3 kilopascals (kPa). "Purify" means to increase concentration of a desired ingredient (up to ≤100%).

"Ranges" relied upon herein describe and contemplate all ranges and subranges including endpoints and whole and/or fractional values therein. A disclosed endpoint or disclosed individual number between endpoints of a range or subrange may be relied upon and provides adequate support for specific inventive embodiments. "Remainder" means a portion that is left behind, e.g., a pot residue after a distillation.

"Separation" means to cause to physically move apart, and thus as a result be no longer in direct touching. "Silanol content" means a concentration of silicon-bonded hydroxyl groups (Si—OH) and is expressed as mole percent (mol %) and is determined by silicon-29 nuclear magnetic resonance ($^{29}$Si—NMR). "Silicone" encompasses linear, branched, and mixtures of linear and branched polyorganosiloxane macromolecules. The branched polyorganosiloxane macromolecules include silsesquioxane resins and resin-linear polyorganosiloxane macromolecules. A silicone may be composed of one or more of M, D, T, and Q units, wherein an M unit is of formula $R^M{}_3SiO_{1/2}$, a D unit is of formula $R^D{}_2SiO_{2/2}$, a T unit is of formula $R^TSiO_{3/2}$, and a Q unit is of formula $SiO_{4/2}$; wherein each $R^M$, $R^D$, and $R^T$ independently is hydrogen, halogen, hydroxyl, or an organic group. "SiOZ" encompasses all silicon-bonded hydroxyl and silicon-bonded O-hydrocarbyl groups. E.g., SiOH, SiOmethyl, SiOethyl, SiOpropyl, and SiO(1-methylpropyl) groups. "Substituents" on organic groups may be designated as "SUB", wherein each SUB independently is a halogen atom, —NH$_2$, —NHR, —NR$_2$, —NO$_2$, —OH, —OR, oxo (=O), —C≡N, —C(=O)—R, —OC(=O)R, —C(=O)OH, —C(=O)OR, —SH, —SR, —SSH, —SSR, —SC(=O)R, —SO$_2$R, —OSO$_2$R, —SiR$_3$, and —Si(OR)$_3$; wherein each R independently is an unsubstituted (C$_1$-C$_{30}$)hydrocarbyl. Halogen atom is F, Cl, Br, or I; alternatively F, Cl, or Br; alternatively F or Cl; alternatively F; alternatively Cl. "Substrate" means a thing having at least one surface upon which a material may be hosted.

"Thereof" shall refer to, and may be amended to be replaced by, that immediately preceding element, member, feature, limitation, list, or group to which reference is being made.

"Vehicle" means a liquid acting as a carrier, hosting medium, dispersant, diluent, supernatant, or solvent for another material, which may or may not be soluble therein.

Any compound includes all "Isotopic forms" thereof, including natural abundance isotopes, isotopically-enriched isotopes, and mixtures thereof. In some aspects, the isotopic forms are the natural abundance isotopes, alternatively the isotopically-enriched isotopes. The isotopically-enriched forms of a silicon-containing compound have a greater-than-natural-abundance amount of deuterium, tritium, $^{29}$Si, $^{30}$Si, $^{32}$Si, or a combination of any two or more thereof. Isotopically-enriched forms of the compound may have additional uses wherein detection of the isotopically-enriched compound or an isotopically-enriched material made or synthesized therefrom would be helpful. Examples of such uses are medical research and anti-counterfeiting applications.

"(C$_2$-C$_{30}$)hydrocarbon-diyl" is a divalent hydrocarbon group containing, when unsubstituted, from 2 to 30 carbon atoms and hydrogen atoms. "(C$_2$-C$_{30}$)hydrocarbon-triyl" is a trivalent hydrocarbon group containing, when unsubstituted, from 2 to 30 carbon atoms and hydrogen atoms. Each radical of the divalent hydrocarbon groups may be on the same carbon atom (germinal), alternatively on different carbon atoms. Each radical of the trivalent hydrocarbon group may be on the same carbon atom (germinal), alternatively two on the same carbon atom and the other on a different carbon atom, alternatively all on different carbon atoms.

"Alloy" means a eutectic or non-eutectic mixture of two or more metals. The mixture may be a solid solution of metallic elements (single phase) or a mixture of two or more metallic elements (two phases).

"Metal" includes, alternatively excludes, the metalloids boron, germanium, and antimony.

"Oximo" means a monovalent oxime group of formula R$_2$C=NO— derived by formally removing the oxygen-bonded hydrogen atom from the oxime, wherein one R is hydrocarbyl and the other R independently is H or hydrocarbyl. The oxime formally is a dehydration reaction product of a reaction of an aldehyde or ketone with hydroxylamine (H$_2$NOH) with concomitant loss of a water molecule so as to formally convert the oxo group (=O) of the aldehyde or ketone to the hydroxyimino (hydroxylimino) group (=NOH) of the oxime. E.g., a (C$_3$)oximo is a monovalent oxime group that formally is a dehydration reaction product of a reaction of a (C$_3$)aldehyde or a (C$_3$)ketone with hydroxylamine. In some aspects, the oximo is derived from an aldehyde, alternatively a ketone.

Each of the metal-polyorganosiloxane materials independently may be further defined by its isotopic composition. Each such inventive material may be a natural abundance isotope form, alternatively an isotopically-enriched form, alternatively a mixture of said forms. The isotopically-enriched forms of the inventive materials include forms that contain a greater-than-natural-abundance amount of deuterium, tritium, $^{29}$Si, $^{30}$Si, $^{32}$Si, or a combination of any two or more thereof. In addition to the uses of the inventive material described herein, isotopically-enriched forms of the inventive material may be useful in applications wherein detection of the isotopically-enriched inventive material or an isotopically-enriched silicon material (e.g., film) made therefrom would be helpful. Examples of such applications are medical research and anti-counterfeiting applications. The inventive material having different isotopic compositions may differ from each other in at least one feature, structure, function, reactivity or property.

The metal-polyorganosiloxane mixture and the metal-polyorganosiloxane composition contain the constituent (A) the polyorganosiloxane that is free of a silicon-bonded organoheteryl group. The constituent (A) and concentration thereof have been described in detail earlier. That description is incorporated here by reference. Suitable (A) polyorganosiloxanes that are free of a silicon-bonded organoheteryl group may be readily synthesized by numerous well-known methods or may be obtained from commercial suppliers such as Dow Corning Corporation, Midland, Mich., USA; Momentive Performance Materials Inc., Waterford, N.Y., USA; or Shin-Etsu Chemical Company, Ltd., Chiyoda-ku, Japan.

The metal-polyorganosiloxane mixture contains the constituent (B) the hydrocarbylene-based multipodal silane. The constituent (B) and concentration thereof have been described in detail earlier. That description is incorporated here by reference. Suitable (B) hydrocarbylene-based multipodal silanes may be readily synthesized by numerous well-known methods or may be obtained from commercial suppliers such as Dow Corning Corporation or Gelest, Inc. (Morrisville, Pa., USA).

The metal-polyorganosiloxane mixture contains the constituent (C) the metal particles. The constituent (C) and concentration thereof have been described in detail earlier. That description is incorporated here by reference. The (C) metal particles may be in the shape of cuboidals, flakes, granules, irregulars, needles, powders, rods, spheres, or a mixture of any two or more of cuboidals, flakes, granules, irregulars, needles, powders, rods, and spheres. The (C) metal particles may have a median particle size of from 5 to 100 μm. The (C) metal particles may be characterizable by a maximum particle size of 1 mm, alternatively 100 microns (μm), alternatively 50 μm, alternatively 10 μm, alternatively 1 μm, alternatively 500 nanometers (nm). Suitable (C) metal particles may be readily prepared by numerous well-known methods or may be obtained from commercial suppliers.

The metal-polyorganosiloxane composition, the cured composite, and the thermally-aged material contain the constituent (B'-C') hydrocarbylene-based multipodal silanoxy-functionalized metal particles. The constituent (B'-C') has been described in detail earlier. That description is incorporated here by reference. In some aspects the metal-polyorganosiloxane composition is free of free (C) metal particles. "Free (C) metal particles" are (C) metal particles lacking the Si—O-Metal bonds described earlier. In some aspects the metal-polyorganosiloxane composition further comprises free constituent (C) metal particles such that the metal-polyorganosiloxane composition comprises constituents (A), (B'-C'), and (C).

In some of the above aspects of the constituent (B'-C'), the constituent (C) the metal particles comprise or consist essentially of aluminum, wherein the aluminum particles have an average particle size of greater than 1 micrometer. Alternatively, constituent (C) comprise or consist essentially of cobalt; alternatively copper; alternatively iron; alternatively nickel; alternatively tin; alternatively titanium; alternatively zinc. Alternatively, constituent (C) comprise or consist essentially of gold; alternatively palladium; alternatively platinum; alternatively silver. Alternatively, the constituent (C) comprise or consist essentially of an alloy of any two of the foregoing metals. Alternatively, the constituent (C) metal particles comprise or consist essentially of core-shell metal particles described earlier.

In some aspects the metal-polyorganosiloxane materials are free of (D) ceramic particles. In other aspects, the metal-polyorganosiloxane mixture further contains the constituent (D) ceramic particles. The constituent (D) has been described in detail earlier. That description is incorporated by reference here. In some aspects the aspects of the metal-polyorganosiloxane composition that further contains the constituent (D) ceramic particles have been made by adding the (D) ceramic particles to a first metal-polyorganosiloxane composition comprising constituents (A) and (B'-C') but lacking constituent (D) to give a second metal-polyorganosiloxane composition comprising the constituents (A), (B'-C'), and (D), wherein constituents (A), (B'-C'), and (D) are as described earlier. In other aspects the aspects of the metal-polyorganosiloxane composition further containing the (D) ceramic particles have been made by adding the (D) ceramic particles to a first metal-polyorganosiloxane mixture comprising constituents (A), (B), and (C) but lacking constituent (D) to give a second metal-polyorganosiloxane mixture comprising the constituents (A), (B), (C), and (D), wherein constituents (A), (B), (C), and (D) are as described earlier; and contacting the constituent (B) with the constituents (C) and (D) in the second metal-polyorganosiloxane mixture to give a third metal-polyorganosiloxane composition comprising constituents (A), (B'-C'), and (B'-D'), wherein constituents (A) and (B'-C') are as defined earlier and constituent (B'-D') is hydrocarbylene-based multipodal silanoxy-functionalized ceramic particles. In some aspects the metal-polyorganosiloxane composition further containing the (D) ceramic particles may optionally further comprise constituent (C'-B'-D'), which comprises a hybrid particle comprising hydrocarbylene-based multipodal silanoxy-functionalized metal-and-ceramic particles. In such aspects is a fourth metal-polyorganosiloxane composition that comprises the constituents (A), (B'-C'), (B'-D'), and (C'-B'-D'). The constituent (B'-D') is different than a combination of constituents (B) and (D) in at least one feature, structure, function, reactivity or property. The constituent (C'-B'-D') is independently different than each of constituent (B'-C') and constituent (B'-D') in at least one feature, structure, function, reactivity or property. The fourth metal-polyorganosiloxane composition comprising the constituents (A), (B'-C'), (B'-D'), and (C'-B'-D') is independently different than the third metal-polyorganosiloxane composition comprising constituents (A), (B'-C'), and (B'-D') and the second metal-polyorganosiloxane composition comprising the constituents (A), (B'-C'), and (D). In some aspects the second, third and fourth metal-polyorganosiloxane compositions independently further comprise unreacted constituent (D) ceramic particles. In some aspects the second, third and fourth metal-polyorganosiloxane compositions are free of unreacted (D) ceramic particles.

The (D) ceramic particles may have sufficient size to improve packing of the (C) metal particles in the metal-polyorganosiloxane composition, cured composite, and/or thermally-aged material such that the metal-polyorganosiloxane composition, cured composite, and/or thermally-aged material has higher thermal conductivity than that of a comparative metal-polyorganosiloxane composition, cured composite, and/or thermally-aged material having the same concentration of (D) ceramic particles having a different (e.g., larger) size. Such sufficient size may be an average particle diameter of the (D) ceramic particles smaller than average particle diameter of the (C) metal particles. The (D) ceramic particles independently may be in the shape of cuboidals, flakes, granules, irregulars, needles, powders, rods, spheres, or a mixture of any two or more of cuboidals, flakes, granules, irregulars, needles, powders, rods, and spheres. When present in the metal-polyorganosiloxane material, the (D) ceramic particles may be at a concentration as described earlier. Suitable (D) ceramic particles may be readily prepared by numerous well-known methods or may be obtained from commercial suppliers.

In some aspects the metal-polyorganosiloxane materials are free of the constituent (E) crosslinker. E.g., when the constituent (A) is a non-curable polyorganosiloxane, the metal-polyorganosiloxane material may be free of (E). In other aspects at least the metal-polyorganosiloxane composition, and optionally the metal-polyorganosiloxane mixture, further comprises the constituent (E) crosslinker. When present in the metal-polyorganosiloxane mixture containing an addition-curable (A) polyorganosiloxane or the metal-polyorganosiloxane composition containing an addition-curable (A) polyorganosiloxane, the (E) crosslinker may be reactive with the addition-curable (A) polyorganosiloxane for forming a crosslinking group between two or more molecules of the addition-curable (A) polyorganosiloxane. The constituent (E) crosslinker may be a SiH-functional organosilicon compound having an average, per molecule, of 2 or more, alternatively from >2 to 5, alternatively from 2 to 4 SiH functional groups. "SiH-functional" means a silicon-bonded hydrogen atom containing group. The SiH-functional organosilicon compound may be an SiH-functional organosilane or an SiH-functional organosiloxane. When the metal-polyorganosiloxane composition further comprises (E), the cured composite prepared therefrom by curing, and typically the thermally-aged composite prepared therefrom by thermal aging of the cured composite, comprises macromolecules composed of a multivalent crosslinking group bonded to two or more groups derived from separate molecules of addition-curable (A) polyorganosiloxane. When present in the metal-polyorganosiloxane mixture or composition, the (E) crosslinker may be at a concentration of from 0.1 wt % to 20 wt % based on total weight of the metal-polyorganosiloxane mixture or composition. Suitable (E) crosslinker may be readily prepared by numerous well-known methods or may be obtained from commercial suppliers such as Dow Corning Corporation.

In some aspects the metal-polyorganosiloxane materials are free of constituent (F) a cure catalyst. In other aspects at least the metal-polyorganosiloxane composition, and optionally the metal-polyorganosiloxane mixture, the cured composite, and/or thermally-aged material, further comprises the constituent (F) cure catalyst. The (F) cure catalyst may be reactive for catalyzing a crosslinking addition reaction between a molecule of the constituent (E) and two or more molecules of the addition-curable (A) polyorganosiloxane.

The addition-curable (A) polyorganosiloxane may be as defined above. The constituent (F) cure catalyst may be a hydrosilylation catalyst and the metal-polyorganosiloxane mixture and composition may be a hydrosilylation-curable metal-polyorganosiloxane mixture and hydrosilylation-curable metal-polyorganosiloxane composition. The hydrosilylation catalyst may comprise a metal; a compound or organometallic complex containing the metal; or any combination thereof. Each metal independently may be platinum, rhodium, ruthenium, palladium, osmium, iridium, or any combination of at least two thereof. Typically, the hydrosilylation catalyst is a platinum hydrosilylation catalyst. Examples of suitable platinum hydrosilylation catalysts are complexes of chloroplatinic acid and certain vinyl-containing organosiloxanes in U.S. Pat. No. 3,419,593 such as the complex of a reaction product of chloroplatinic acid and 1,3-diethenyl-1,1,3,3-tetramethyldisiloxane. The hydrosilylation catalyst may be unsupported, alternatively supported (disposed) on a solid support (e.g., particulate carbon, silica, or alumina). The supported hydrosilylation catalyst differs from a catalyst metal-free filler comprising a particulate solid such as particulate carbon, silica, or alumina in at least one feature, structure, function, reactivity or property.

The hydrosilylation catalyst aspect of constituent (F) may be configured in the hydrosilylation-curable metal-polyorganosiloxane mixture or composition for increased stability during storage of the hydrosilylation-curable metal-polyorganosiloxane mixture or composition containing same and before curing thereof. For example, the hydrosilylation catalyst may be microencapsulated in a thermoplastic resin for increased storage stability. The microencapsulated hydrosilylation catalyst comprises a core of the hydrosilylation catalyst surrounded and hermetically covered by a shell of the thermoplastic resin. Typically, the storage of the hydrosilylation-curable metal-polyorganosiloxane mixture or composition containing the microencapsulated hydrosilylation catalyst is done at a temperature less than the melting or softening point of the thermoplastic resin. When curing is desired, the microencapsulated catalyst (e.g., see U.S. Pat. Nos. 4,766,176 and 5,017,654) may be heated in the hydrosilylation-curable metal-polyorganosiloxane mixture or composition above the melting or softening point of the thermoplastic resin, thereby exposing the hydrosilylation catalyst core to the constituents (A) and (E) of the hydrosilylation-curable metal-polyorganosiloxane mixture or composition and catalyzing hydrosilylation curing thereof. Alternatively, the hydrosilylation catalyst in the hydrosilylation-curable metal-polyorganosiloxane mixture or composition may be a photoactivatable catalyst for increased storage stability. Examples of photoactivatable catalysts are platinum (II) β-diketonate complexes such as platinum (II) bis(2,4-pentanedionate). Typically, storage of the hydrosilylation-curable metal-polyorganosiloxane mixture or composition containing the photoactivatable catalyst is done in absence of light of wavelengths used for photoactivation of the photoactivatable catalyst. For example, the hydrosilylation-curable metal-polyorganosiloxane mixture or composition containing the photoactivatable catalyst may be stored in a container that blocks light at one or more wavelengths of from 150 to 800 nanometers (nm). When curing is desired, the photoactivatable catalyst may be exposed in the hydrosilylation-curable metal-polyorganosiloxane mixture or composition to ultraviolet radiation having a wavelength of from 150 to 800 nm, thereby activating the photoactivatable catalyst in the presence of the constituents (A) and (E) and catalyzing hydrosilylation curing thereof. When present in the metal-polyorganosiloxane material, the (F) cure catalyst may be at a concentration of from 1 to 1,000 parts per million (ppm) based on total weight of the metal-polyorganosiloxane material. Suitable (F) cure catalyst may be readily prepared by numerous well-known methods or may be obtained from commercial suppliers such as Dow Corning Corporation.

In some aspects the metal-polyorganosiloxane materials are free of the constituent (G) catalyst inhibitor. In other aspects at least the metal-polyorganosiloxane composition, and optionally the metal-polyorganosiloxane mixture, cured composite, and/or thermally-aged material, further comprises the constituent (G) catalyst inhibitor. The (G) catalyst inhibitor is effective at 23° C. for inhibiting curing of the metal-polyorganosiloxane mixture and/or composition catalyzed by constituent (F). The (G) catalyst inhibitor may be an inhibitor of a hydrosilylation catalyst, such as an inhibitor of a platinum hydrosilylation catalyst. Inhibitors of hydrosilylation catalysts are known. For example, the hydrosilylation catalyst inhibitor may be any one of the compounds described for component j) in US 2016/0032060 A1. Examples of the compounds are ethylenically-unsaturated or aromatically-unsaturated amides, acetylenic compounds, unsaturated hydrocarbon dicarboxylic esters, conjugated ene-ynes, olefinic siloxanes, hydroperoxides, nitriles, diaziridines, carboxylic esters derived from carboxylic acids and unsaturated alcohols, amines, phosphines, sulfur compounds, hydroperoxy compounds, and combinations of any two or more thereof. When present in the metal-polyorganosiloxane material, the (G) catalyst inhibitor may be at a concentration of from 1 part to 100 parts per 100 parts of (F) cure catalyst. Suitable (G) catalyst inhibitor may be readily prepared by numerous well-known methods or may be obtained from commercial suppliers such as Sigma-Aldrich Company, St. Louis, Mo., USA.

In some aspects the metal-polyorganosiloxane materials are free of the constituent (H) adhesion promoter. In other aspects at least the metal-polyorganosiloxane composition, and optionally the metal-polyorganosiloxane mixture, cured composite, and/or thermally-aged material, further comprises the constituent (H) adhesion promoter. Examples of suitable adhesion promoters include an alkoxysilane such as an epoxy-functional alkoxysilane, or a mercapto-functional compound; a combination of an alkoxysilane and a hydroxy-functional polyorganosiloxane; a mercapto-functional compound; an unsaturated compound; an epoxy-functional silane; an epoxy-functional siloxane; a combination, such as a reaction product, of an epoxy-functional silane or epoxy-functional siloxane and a hydroxy-functional polyorganosiloxane; or a combination thereof. Suitable adhesion promoters are known in the art and are commercially available. For example, Silquest® A186 is beta-(3,4-epoxycyclohexyl)ethyltrimethoxysilane which is commercially available from Crompton OSi Specialties of Middlebury, Conn., USA. CD9050 is a monofunctional acid ester useful as an adhesion promoter that provides adhesion to metal substrates and is designed for radiation curable compositions. CD9050 is commercially available from Sartomer Co. SR489D is tridecyl acrylate, SR395 is isodecyl acrylate, SR257 is stearyl acrylate, SR506 is isobornyl acrylate, SR833S is tricyclodecane dimethanol diacrylate, SR238 is 1,6-hexanediol diacrylate, and SR351 is trimethylol propane triacrylate, all of which are also commercially available from Sartomer Co. Other suitable adhesion promoters, which are useful to promote adhesion to metals, include maleic anhydride, methacrylic anhydride, and glycidyl methacrylate.

Constituent (H) adhesion promoter may be an unsaturated or epoxy-functional compound. Suitable epoxy-functional compounds are known in the art and commercially available, see for example, U.S. Pat. Nos. 4,087,585; 5,194,649; 5,248,715; and 5,744,507 (at columns 4-5). Constituent (H) may comprise an unsaturated or epoxy-functional alkoxysilane. For example, the functional alkoxysilane can have the formula $R^{20}{}_v Si(OR^{21})_{(4-v)}$, where subscript v is 1, 2, or 3, alternatively v is 1. Each $R^{20}$ is independently a monovalent organic group with the proviso that at least one $R^{20}$ is an unsaturated organic group or an epoxy-functional organic group. Epoxy-functional organic groups for $R^{20}$ are exemplified by 3-glycidoxypropyl and (epoxycyclohexyl)ethyl. Unsaturated organic groups for $R^{20}$ are exemplified by 3-methacryloyloxypropyl, 3-acryloyloxypropyl, and unsaturated monovalent hydrocarbon groups such as vinyl, allyl, hexenyl, undecylenyl. Each $R^{21}$ is independently an unsubstituted, saturated hydrocarbon group of 1 to 4 carbon atoms, alternatively 1 to 2 carbon atoms. $R^{21}$ is exemplified by methyl, ethyl, propyl, and butyl.

Examples of suitable epoxy-functional alkoxysilanes for constituent (H) include 3-glycidoxypropyltrimethoxysilane, 3-glycidoxypropyltriethoxysilane, (epoxycyclohexyl)ethyldimethoxysilane, (epoxycyclohexyl)ethyldiethoxysilane and combinations thereof. Examples of suitable unsaturated alkoxysilanes include vinyltrimethoxysilane, allyltrimethoxysilane, allyltriethoxysilane, hexenyltrimethoxysilane, undecylenyltrimethoxysilane, 3-methacryloyloxypropyl trimethoxysilane, 3-methacryloyloxypropyl triethoxysilane, 3-acryloyloxypropyl trimethoxysilane, 3-acryloyloxypropyl triethoxysilane, and combinations thereof. Alternatively, examples of suitable adhesion promoters include glycidoxypropyltrimethoxysilane and a combination of glycidoxypropyltrimethoxysilane with an aluminum chelate or zirconium chelate.

Alternatively, constituent (H) may comprise an epoxy-functional siloxane such as a reaction product of a hydroxy-terminated polyorganosiloxane with an epoxy-functional alkoxysilane, as described above, or a physical blend of the hydroxy-terminated polyorganosiloxane with the epoxy-functional alkoxysilane. Constituent (H) may comprise a combination of an epoxy-functional alkoxysilane and an epoxy-functional siloxane. For example, constituent (H) is exemplified by a mixture of 3-glycidoxypropyltrimethoxysilane and a reaction product of hydroxy-terminated methylvinylsiloxane with 3-glycidoxypropyltrimethoxysilane, or a mixture of 3-glycidoxypropyltrimethoxysilane and a hydroxy-terminated methylvinylsiloxane, or a mixture of 3-glycidoxypropyltrimethoxysilane and a hydroxy-terminated methylvinyl/dimethylsiloxane copolymer. When used as a physical blend rather than as a reaction product, these components may be stored separately in multiple-part kits.

Suitable mercapto-functional compounds for constituent (H) include an organomercaptan, a mercapto containing silane, or a combination thereof. Suitable mercapto containing silanes include 3-mercaptopropyltrimethoxysilane. Suitable mercapto-functional compounds are disclosed in U.S. Pat. No. 4,962,076.

When present in the metal-polyorganosiloxane material, the (H) adhesion promoter may be at a concentration of from 0.1 to 5 wt % in the metal-polyorganosiloxane materials. Suitable (H) adhesion promoter may be readily prepared by numerous well-known methods or may be obtained from commercial suppliers such as Dow Corning Corporation.

In some aspects the metal-polyorganosiloxane materials are free of constituent (I) the rheology modifier. Typically, at least the metal-polyorganosiloxane composition, and optionally the metal-polyorganosiloxane mixture, cured composite, and/or thermally-aged material, further comprises the constituent (I) rheology modifier. Rheology modifiers can be added to change the thixotropic properties of the composition. Rheology modifiers include flow control additives; reactive diluents (see below); anti-settling agents; alpha-olefins; hydroxyl-terminated silicone-organic copolymers, including but not limited to hydroxyl-terminated polypropyleneoxide-dimethylsiloxane copolymers; and combinations of any two or more thereof. Examples of suitable rheology modifiers are end-capped polydimethylsiloxane fluids, e.g., end-capped linear polydimethylsiloxane fluids having from 10 to 500 D units, alternatively from 20 to 400 D units, alternatively from 50 to 250 D units; e.g., linear polydimethylsiloxane fluids having an average, per molecule, of 14, 26, 31, 45, 53, 68, 72, 89, 90, 108, 117, 127, 139, 144, 150, 169, 171, 183, 194, 207, 213, 225, 237, 248 333, or 459 D units. The end-capped linear polydimethylsiloxane fluids may be symmetrically end-capped with trialkylsilyl groups (e.g., trimethylsilyl or triethylsilyl) or trialkoxysilyl groups (e.g., trimethoxysilyl or triethoxysilyl); or asymmetrically end-capped with a trialkylsilyl group and a trialkoxysilyl group. When present in the metal-polyorganosiloxane material, the amount of constituent (I) may range from 0.01 to 50 wt %, alternatively from 1 to 30 wt %, alternatively from 2 to 20 wt % based on the total weight of the metal-polyorganosiloxane material. Suitable (I) rheology modifier may be readily prepared by numerous well-known methods or may be obtained from commercial suppliers such as Dow Corning Corporation, The Dow Chemical Company (Midland, Mich., USA), and Exxon-Mobil Corporation (Irving, Tex., USA).

In aspects the metal-polyorganosiloxane materials are free of constituent (J) the antioxidant. In other aspects at least the metal-polyorganosiloxane composition, and optionally the metal-polyorganosiloxane mixture, cured composite, and/or thermally-aged material, further comprises the constituent (J) antioxidant. Examples of suitable (J) are butylated hydroxy toluene and hydroquinones. When present in the metal-polyorganosiloxane material, the amount of constituent (j) may range from 0.01 to 10 wt %, alternatively from 0.05 to 5 wt %, alternatively from 0.1 to 5 wt % based on the total weight of the metal-polyorganosiloxane material. Suitable (J) antioxidant may be readily prepared by numerous well-known methods or may be obtained from commercial suppliers such as Sigma-Aldrich Company.

In some aspects the metal-polyorganosiloxane materials are free of the constituent (K) thixotropic agent. In other aspects at least the metal-polyorganosiloxane composition, and optionally the metal-polyorganosiloxane mixture, cured composite, and/or thermally-aged material, further comprises the constituent (K) thixotropic agent. Examples of suitable (K) are fumed silica, multi-walled carbon nanotubes, and zinc oxide. The (K) thixotropic agent is any finely divided solid lacking electrically conductive metal and that modulates a Thixotropic Index($\eta_1/\eta_{10}$) of the aspects of the metal-polyorganosiloxane composition, and optionally of the aspects of the metal-polyorganosiloxane mixture, containing (K). The Thixotropic Index($\eta_1/\eta_{10}$) may be determined according to the Thixotropic Index Test Method 1 described later. The Thixotropic Index($\eta_1/\eta_{10}$) of the metal-polyorganosiloxane composition, and optionally of the aspects of the metal-polyorganosiloxane mixture, may be from 3 to 10. Examples of the (K) thixotropic agent are carbon nanotubes; electrically non-conductive filler particles; or a combination of any two or more of the carbon nanotubes and electrically non-conductive filler particles. The electrically non-conductive filler particles are finely-divided solids having a volume resistivity ($\rho$) at 20° C. greater than 100 Ohm-centimeter (Ohm-cm) and an electrical conductivity (K) at 20° C. less than 1.0 Siemens per meter (S/m). The (K) thixotropic agent may consist of the electrically non-conductive filler particles, alternatively (K) the thixotropic agent may be free of the electrically non-conductive filler particles. The electrically non-conductive filler particles may be a silicate glass (e.g., soda-lime-silica glass or borosilicate glass), diamond polymorph of carbon, silica, organic polymer, organosiloxane polymer, or the (D) ceramic particles. When present in the metal-polyorganosiloxane material, the amount of constituent (K) may range from 0.1 to 5 wt %, alternatively from 0.2 to 3 wt %, alternatively from 0.5 to 2 wt % based on the total weight of the metal-polyorganosiloxane material. Suitable (K) thixotropic agent may be readily prepared by numerous well-known methods or may be obtained from commercial suppliers.

In some aspects the metal-polyorganosiloxane materials are free of constituent (L) the colorant. In other aspects at least the metal-polyorganosiloxane composition, and optionally the metal-polyorganosiloxane mixture, cured composite, and/or thermally-aged material, further comprises the constituent (L) colorant. The colorant may be effective for imparting a visible color to the metal-polyorganosiloxane mixture/composition. The colorant may be a dye such as a fluorescent dye or an absorbing dye, a phosphor, a pigment, an optical diffusant, a photonic crystal, a plurality of quantum dots, nanoparticulate titanium dioxide, carbon nanotubes, and combinations of any two or more thereof. Examples of colorants are known in the art and are disclosed in U.S. Pat. Nos. 4,962,076; 5,051,455; and 5,053,442. The amount of constituent (L) depends on various factors including the optically active agent selected and the end use application. When present in the metal-polyorganosiloxane material, the amount of constituent (L) may range from 0.01 to 50 wt %, alternatively from 0.1 to 10 wt %, alternatively from 0.5 to 2 wt % based on the total weight of the metal-polyorganosiloxane material. Suitable (L) colorant may be readily prepared by numerous well-known methods or may be obtained from commercial suppliers.

In some aspects the metal-polyorganosiloxane materials are free of the constituent (M) coupling initiator. In other aspects at least the metal-polyorganosiloxane composition, and optionally the metal-polyorganosiloxane mixture, cured composite, and/or thermally-aged material, further comprises the constituent (M) coupling initiator. The coupling initiator is effective for initiating a condensation coupling reaction between constituent (B) and constituent (C). Because the metal-polyorganosiloxane materials are free of a moisture-curable polyorganosiloxane, the (M) coupling initiator does not function to initiate condensation curing of the metal-polyorganosiloxane materials. A suitable (M) may be tetrabutyl titanate. When present in the metal-polyorganosiloxane material, the amount of constituent (M) may range from 0.01 to 5 wt %, alternatively from 0.05 to 3 wt %, alternatively from 0.1 to 2 wt % based on the total weight of the metal-polyorganosiloxane material. Suitable (M) coupling initiator may be readily prepared by numerous well-known methods or may be obtained from commercial suppliers.

In some aspects the metal-polyorganosiloxane materials are free of constituent (N) the vehicle. In other aspects at least the metal-polyorganosiloxane mixture, and optionally the metal-polyorganosiloxane composition, cured composite, and/or thermally-aged material, further comprises the constituent (N) vehicle. Types of the vehicle may be selected from a solvent, a diluent, and a dispersant. Examples of (N) vehicle are organic solvents such as toluene, xylenes, heptane, methyl ethyl ketone, and tetrahydrofuran and low kinematic viscosity silicone fluids such as a polydimethylsiloxane having a kinematic viscosity from 1 to 5 centipoise at 25° C. When present in the metal-polyorganosiloxane material, the amount of constituent (N) may range from 0.1 to 50 wt %, alternatively from 1 to 30 wt %, alternatively from 1 to 20 wt % based on the total weight of the metal-polyorganosiloxane material. Suitable (N) vehicle may be readily prepared by numerous well-known methods or may be obtained from commercial suppliers such as The Dow Chemical Company or Sigma-Aldrich Company.

In some aspects the metal-polyorganosiloxane materials are free of constituent (O) the reactive diluent. In other aspects at least the metal-polyorganosiloxane composition, and optionally the metal-polyorganosiloxane mixture, cured composite, and/or thermally-aged material, further comprises the constituent (O) reactive diluent. Examples of suitable reactive diluents are those described in paragraph [0160 to [0162] of US 2015/0376481 A1 to K. Larson, et al. The (O) reactive diluent may be a type of (N) vehicle having at least one curable functional group that can participate in the reaction comprising curing of the metal-polyorganosiloxane composition to give the cured composite. As such a participant, the (O) reactive diluent has one or more covalent bonds to the silicone matrix of the cured composite. Typically, the (O) reactive diluent also has one or more covalent bonds to the silicone matrix of the thermally-aged composite prepared from the cured composite. When present in the metal-polyorganosiloxane material, the amount of constituent (O) may range from 0.01 to 30 wt %, alternatively from 0.1 to 20 wt %, alternatively from 1 to 10 wt % based on the total weight of the metal-polyorganosiloxane material. Aspects of the metal-polyorganosiloxane materials may be free of other types of the (N) vehicle, but nevertheless may contain (O) reactive diluent. Conversely, other aspects of the metal-polyorganosiloxane materials may be free of (O) reactive diluent, but nevertheless may contain other types of the (N) vehicle. Other aspects of the metal-polyorganosiloxane materials may be free of both the (N) vehicle and the (O) reactive diluent. Suitable (O) reactive diluent may be readily prepared by numerous well-known methods or may be obtained from commercial suppliers.

In some aspects the metal-polyorganosiloxane materials are free of the constituent (P) acid acceptor. In other aspects at least the metal-polyorganosiloxane composition, and optionally the metal-polyorganosiloxane mixture, cured composite, and/or thermally-aged material, further comprises the constituent (P) acid acceptor. When present in the metal-polyorganosiloxane material, the amount of constituent (P) may range from 0.01 to 5 wt %, alternatively from 0.05 to 3 wt %, alternatively from 0.1 to 2 wt % based on the total weight of the metal-polyorganosiloxane material. Suitable (P) acid acceptor may be readily prepared by numerous well-known methods or may be obtained from commercial suppliers.

In some aspects the metal-polyorganosiloxane materials are free of constituent (Q) the corrosion inhibitor. In other aspects at least the cured composite and thermally-aged material, and optionally the metal-polyorganosiloxane mixture and/or metal-polyorganosiloxane composition, further comprises the constituent (Q) corrosion inhibitor. Suitable corrosion inhibitors are benzotriazole; a mercaptobenzotriazole such as 2,5-dimercapto-1,3,4-thiadiazole (e.g., CUV AN 826 from R. T. Vanderbilt), and alkylthiadiazole (e.g., CUV AN 484 from R. T. Vanderbilt). When present in the metal-polyorganosiloxane material, the amount of constituent (Q) may range from 0.01 to 0.5 wt %, alternatively from 0.05 to 0.5 wt % based on the total weight of the metal-polyorganosiloxane material. Suitable (Q) corrosion inhibitor may be readily prepared by numerous well-known methods or may be obtained from commercial suppliers.

In some aspects the metal-polyorganosiloxane materials are free of constituent (R) the radical cure initiator. In other aspects at least the metal-polyorganosiloxane composition, and optionally the metal-polyorganosiloxane mixture, cured composite, and/or thermally-aged material, further comprises the constituent (R) radical cure initiator. The aspects of the metal-polyorganosiloxane composition and the metal-polyorganosiloxane mixture that further comprise the constituent (R) radical cure initiator are a radical-curable metal-polyorganosiloxane composition and a radical-curable metal-polyorganosiloxane mixture. The radical cure initiator may be effective for initiating a radical addition reaction between two or more molecules of constituent (A) wherein constituent (A) is a radical-curable polyorganosiloxane containing an average, per molecule, of at least 1 aliphatically unsaturated organic group. The (R) radical cure initiator may be any compound that generates a free radical at elevated temperature. The (R) radical cure initiator may be an organic peroxide such as hydroperoxide, a diacyl peroxide, a ketone peroxide, a peroxyester, a dialkyl peroxide, a peroxydicarbonate, a peroxyketal, a peroxy acid, an acyl alkylsulfonyl peroxide, or an alkyl monoperoxydicarbonate. Specific examples of suitable peroxides include: 2,5-dymethyl-2,5-di(tert-butylperoxy)hexane, benzoyl peroxide; dicumyl peroxide; t-butyl peroxy O-toluate; cyclic peroxyketal; t-butyl hydroperoxide; t-butylperoxypivalate; lauroyl peroxide; t-amyl peroxy 2-ethylhexanoate; vinyltris(t-butyl peroxy) silane; di-t-butyl peroxide; 1,3-bis(t-butylperoxyisoprpyl) benzene; 2,2,4-trimethylpentyl-2-hydroperoxide; and 2,5-bis(t-butylperoxy)-2,5-dimethylhexyne-3-(t-butylperoxy)-3,5,5-trimethylhexanoate. The "t-butyl" means tertiary-butyl, i.e., 1,1-dimethylethyl. When present in the metal-polyorganosiloxane material, the amount of constituent (R) may range from 0.01 to 5 wt %, alternatively from 0.05 to 3 wt %, alternatively from 0.1 to 2 wt % based on the total weight of the radical-curable metal-polyorganosiloxane material. Suitable (R) radical cure initiator may be readily prepared by numerous well-known methods or may be obtained from commercial suppliers such as Sigma-Aldrich Company.

In some aspects the metal-polyorganosiloxane materials are free of constituent (S) chain extender. In other aspects the metal-polyorganosiloxane materials (e.g., the mixture or composition) further comprise constituent (S) chain extender. The (S) chain extender may be a curable group-functional organosiloxane having an average, per molecule, of from 1 to <2 curable groups. The curable group may be reactable with a functional group of the curable (A) polyorganosiloxane or the (E) crosslinker. For example, the (S) chain extender may be a SiH-functional organosiloxane having an average, per molecule, of from 1 to <2 silicon-bonded hydrogen atoms. Alternatively, the (S) chain extender may be an alkenyl-functional organosiloxane having an average, per molecule, of from 1 to <2 aliphatically unsaturated groups, such as $(C_2-C_6)$alkenyl groups. The organosiloxane may be an oligodiorganosiloxane or a polydiorganosiloxane. The (S) chain extender differs from the (E) crosslinker in the average number, per molecule, of curable groups. As described above, the (S) chain extender contains on average, per molecule, of from 1 to less than 2 curable groups, whereas the (E) crosslinker has an average, per molecule, of 2 or more curable groups. When present in the metal-polyorganosiloxane material, the amount of constituent (S) may range from 0.05 to 5 wt %, alternatively from 0.1 to 3 wt %, alternatively from 0.1 to 1 wt % based on the total weight of the radical-curable metal-polyorganosiloxane material. Suitable (S) chain extender may be readily prepared by numerous well-known methods or may be obtained from commercial suppliers such as Dow Corning Corporation.

In some aspects the metal-polyorganosiloxane materials are free of constituent (T) treating agent. In other aspects the metal-polyorganosiloxane materials (e.g., the mixture or composition) further comprise constituent (T) treating agent. In some aspects the (T) treating agent may be used in combination with the (M) coupling initiator. The treating agent may be useful for treating the (D) ceramic particles. The (D) ceramic particles may be treated with (T) treating agent to give a treated form of the (D) ceramic particles, wherein the treated form of (D) is used in the above aspects containing (D). Examples of suitable treating agents are disclosed in U.S. Pat. No. 6,169,142 at column 4, line 42, to column 5, line 2; and in U.S. Pat. No. 8,258,502 B2, for "component (VII)" in column 7, line 64, to column 8, line 50. When present in the metal-polyorganosiloxane material, the amount of constituent (T) may range from 0.01 to 5 wt %, alternatively from 0.05 to 2 wt %, alternatively from 0.1 to 1 wt % based on the total weight of the radical-curable metal-polyorganosiloxane material. Suitable (T) treating agent may be readily prepared by numerous well-known methods or may be obtained from commercial suppliers such as Dow Corning Corporation.

In some aspects the metal-polyorganosiloxane materials are free of constituent (U) reactive compound. In other aspects the metal-polyorganosiloxane materials (e.g., the mixture or composition) further comprise constituent (U) reactive compound. The (U) reactive compound may be any species that can provide addition curable groups in a clustered functional polyorganosiloxane. The reactive compound has an average, per molecule, of at least one aliphatically unsaturated hydrocarbyl group that is capable of undergoing an addition reaction with a silicon bonded hydrogen atom of another constituent such as constituent (E). Constituent (U) further comprises one or more other addition curable groups per molecule. The other addition curable groups are functional (reactive) groups that render the clustered functional polyorganosiloxane (prepared by a process of addition curing a mixture of constituents (A), (E), and (U)) curable. The other addition curable groups on constituent (U) may be (meth)acrylate, epoxy, isocyanate, or a combination of any two or more thereof; alternatively (meth)acrylate; alternatively epoxy; alternatively isocyanate; alternatively the combination. Where all of the curable groups provided by constituent (U) are the same reaction type (e.g., the aliphatically unsaturated hydrocarbyl group such as vinyl and a (meth)acrylate group, both groups having a carbon-carbon bond that can undergo an SiH addition reaction), the product of the process is deemed a "single cure type" clustered functional polyorganosiloxane. Where two or more different types of curable groups are provided by constituent (U), e.g., unsaturated hydrocarbyl and epoxy or unsaturated hydrocarbyl and isocyanate, the product is deemed a "multiple cure" clustered functional polyorganosiloxane. Constituent (U) may be one reactive compound, or a combination comprising two or more reactive compound. When constituent (U) comprises two or more reactive compounds, the two or more reactive compounds may have two or more different curable groups. Constituent (U) may comprise a silicon containing compound or a silicon-free organic compound. Alternatively, constituent (U) may comprise a silicon containing reactive compound, such as a silane containing an unsaturated hydrocarbyl group and at least one other type of addition curable group.

When present in the metal-polyorganosiloxane material, the amount of constituent (U) may range from 0.1 to 10 wt %, alternatively from 0.2 to 5 wt %, alternatively from 0.5 to 3 wt % based on the total weight of the radical-curable metal-polyorganosiloxane material. Suitable (V) reactive compound may be readily prepared by numerous well-known methods or may be obtained from commercial suppliers such as Dow Corning Corporation.

When selecting constituents for the metal-polyorganosiloxane mixture/composition, there may be functional overlap between constituents that may have more than one function. For example, certain alkoxysilanes may be useful as treating agents and as adhesion promoters. Non-reactive polydiorganosiloxanes such as polydimethylsiloxanes may be useful as the (A) non-curable polyorganosiloxanes and as solvents.

The following aspects are optional embodiments or limitations. They are provided with the understanding that to the extent that any of them conflict with the descriptions of the metal-polyorganosiloxane mixture/composition, cured composite and thermally-aged material herein, the descriptions control. In some aspects at least one, alternatively each of the metal-polyorganosiloxane mixture/composition, cured composite, and thermally-aged material is free of a polyorganosiloxane having an average, per molecule, of two or more aliphatically unsaturated organic groups. In some aspects at least one, alternatively each of the metal-polyorganosiloxane mixture/composition, cured composite, and thermally-aged material is free of a polyorganosiloxane having an average, per molecule, two or more free radical curable groups. In some aspects at least one, alternatively each of the metal-polyorganosiloxane mixture/composition, cured composite, and thermally-aged material is free of copper powder and nickel powder. In some aspects at least one, alternatively each of the metal-polyorganosiloxane mixture/composition, cured composite, and thermally-aged material is free of a silane pre-treated metal powder, which is a metal powder that has had its surface treated with a silane compound in the absence of a polyorganosiloxane, i.e., before the metal powder has been contacted with the, e.g., the constituent (A). In some aspects at least one, alternatively each of the metal-polyorganosiloxane mixture/composition, cured composite, and thermally-aged material is free of metal particles having a density ≥11 grams per cubic centimeter (g/cm$^3$). Said differently, in some aspects the density of the metal particles of the metal-polyorganosiloxane mixture/composition, cured composite, and thermally-aged material is from 1.7 to <11 g/cm$^3$, alternatively from 2.5 to <11 g/cm$^3$, alternatively from 3 to <11 g/cm$^3$. In some aspects at least one, alternatively each of the metal-polyorganosiloxane mixture/composition, cured composite, and thermally-aged material is free of tungsten, uranium (natural, enriched, or depleted), lead, osmium, iridium, platinum, rhenium, gold, neptunium, plutonium, and tantalum. In some aspects at least one, alternatively each of the metal-polyorganosiloxane mixture/composition, cured composite, and thermally-aged material is free of an encapsulated biocide. In some aspects at least one, alternatively each of the metal-polyorganosiloxane mixture/composition, cured composite, and thermally-aged material is free of a titanium-hydrocarbyloxide complex such as a titanium-alkoxide complex. In some aspects at least one, alternatively each of the metal-polyorganosiloxane mixture/composition, cured composite, and thermally-aged material is free of aluminum and iron. In some aspects at least one, alternatively each of the metal-polyorganosiloxane mixture/composition, cured composite, and thermally-aged material is free of a noble metal oxide such as an oxide of Fe, Ir, Pd, Pt, Rh, or Ru. In some aspects at least one, alternatively each of the metal-polyorganosiloxane mixture/composition, cured composite, and thermally-aged material is free of a telechelic oligomer or polymer. In some aspects at least one, alternatively each of the metal-polyorganosiloxane mixture/composition, cured composite, and thermally-aged material is free of a silicate; silica; barium oxide; quartz; montmorilonite clays; phosphates; alumina such as hydroxyapatite alumina; magnesia; zirconia; metal carbonates such as carbonates of Ca or Zn; oxides of tantalum, tin or titanium; titania; nitrides of aluminum, silicon, or titanium; carbides of silica, aluminum, or titanium; carbon nanotubes; diatomaceous earth; hydroxides of aluminum; and fibers such as polymer fibers, silicate fibers, or whisper fibers. In some aspects at least one, alternatively each of the metal-polyorganosiloxane mixture/composition, cured composite, and thermally-aged material is free of a tin catalyst, alternatively free of tin. In some aspects at least one, alternatively each of the metal-polyorganosiloxane mixture/composition, cured composite, and thermally-aged material is free of silicas, carbon blacks, and active carbons. In some aspects at least one, alternatively each of the metal-polyorganosiloxane mixture/composition, cured composite, and thermally-aged material is free of a product of a reaction between an amine and an epoxide. In some aspects at least one, alternatively each of the metal-polyorganosiloxane mixture/composition, cured composite, and thermally-aged material is free of zirconium. In some aspects at least one, alternatively each of the metal-polyorganosiloxane mixture/composition, cured composite, and thermally-aged material is free of a hydroxyl-endblocked polydiorganosiloxane. In some aspects at least one, alternatively each of the metal-polyorganosiloxane mixture/composition, cured composite, and thermally-aged material is free of an oxaldianilide. In some aspects at least one, alternatively each of the metal-polyorganosiloxane mixture/composition, cured composite, and thermally-aged material is free of an organosilicon compound containing a basic nitrogen atom, alternatively containing any nitrogen atom. In some aspects at least one, alternatively each of the metal-polyorganosiloxane mixture/composition, cured composite, and thermally-aged material is free of organic polymers and siloxane-organic copolymers. In some aspects at least one, alternatively each of the metal-polyorganosiloxane mixture/composition, cured composite, and thermally-aged material is free of a silicon-containing polymer prepared from a dipodal silane. In some aspects at least one, alternatively each of the metal-polyorganosiloxane mixture/composition, cured composite, and thermally-aged material is free of an isocyanate, urea, or carbamate functional group. In some aspects at least one, alternatively each of the metal-polyorganosiloxane mixture/composition, cured composite, and thermally-aged material is free of a heterometallic complex containing two or more different metals. In some aspects at least one, alternatively each of the metal-polyorganosiloxane mixture/composition, cured composite, and thermally-aged material is free of iron balls. In some aspects at least one, alternatively each of the metal-polyorganosiloxane mixture/composition, cured composite, and thermally-aged material is free of a metal oxide powder. In some aspects at least one, alternatively each of the metal-polyorganosiloxane mixture/composition, cured composite, and thermally-aged material is free of a phosphor. In some aspects at least one, alternatively each of the metal-polyorganosiloxane mixture/composition, cured composite, and thermally-aged material is free of a functional group selected from C—C(=O)—C(ketone), C—C(=O)—H (aldehyde), C≡N (nitrile), S—O containing group (e.g., sulfoxide, sulfone, sulfite, sulfate, sulfonate), thiol group (—SH), carboxylic ester group (C(=O)—O—C), nitro group (—$NO_2$), or amino group (—$NH_2$). In some aspects at least one, alternatively each of the metal-polyorganosiloxane mixture/composition, cured composite, and thermally-aged material is free of a chemical element of any one of Groups 2 to 13 of the Periodic Table of the Elements. In some aspects at least one, alternatively each of the metal-polyorganosiloxane mixture/composition, cured composite, and thermally-aged material is free of all of the foregoing exclusions in this paragraph. The foregoing exclusions (free of aspects) support provisos. The foregoing exclusions also demonstrate that the excluded subject matter is contemplated for inclusion in the broadest embodiments, otherwise the subject matter would not need to be excluded in the foregoing aspects.

The metal-polyorganosiloxane mixture and composition independently may be prepared as a one-part formulation or as two-part formulation. For example, the one-part formulation may be prepared by combining constituents (A) to (C) plus any optional constituents such as any one or more of constituents (D) to (U) by any convenient means, such as mixing or blending. The two-part formulation may be prepared by combining constituent (A) in a primary part and constituents (B) and (C) in a secondary part. One or more additional constituents (D) to (U) may independently be added to the primary part and/or secondary part so long as initiation of curing or reacting is avoided. Typically, the formulations are stored in sealed containers until ready for use.

The metal-polyorganosiloxane materials may be used as thermally conductive materials (TCMs) in applications and devices in need of heat management. Examples of the TCMs include thermal interface materials (TIMs). Examples of the TIMs are thermal adhesives or glues, thermal gap fillers, thermal gels, and thermal greases. The thermal greases may be used as an interface material between components such as heat sinks and integrated circuits. Typically, the thermal greases do not provide adhesion to these components. If mechanical strength is desired in an assembly using the thermal grease, the assembly may further use a support member such as a bracket. The thermal adhesives or glues may be used in place of thermal greases and additionally provide mechanical strength to the assembly of components. E.g., thermal adhesives may be used to bond heat sinks to integrated circuits in an assembly when there is no other mounting mechanism available. The thermal gap fillers, such as putties and sheets, may be used to fill air gaps between adjacent components and enhance heat transfer therebetween. The thermal gels may be configured in the form of a soft, flexible defined shape such as pad, and are easy to apply.

The metal-polyorganosiloxane materials may be used with optical components, electronic components, and automotive mechatronics. Examples of the optical components are laser diodes, multiplexers, and transceivers. Examples of the electronic components are integrated circuits (ICs) such as flip chip ICs; central processing units (CPUs); microprocessors; power semiconductors and modules; sensors; power supplies; high speed mass storage drives; motor controls; and high voltage transformers.

The metal-polyorganosiloxane materials may have a thermal conductivity of thermal conductivity of ≥0.2 Watt per meter-Kelvin (W/m·K), alternatively more than 0.5, 1.0, 1.5, and further more than 2.0 W/m·K.

The metal-polyorganosiloxane materials also may be used in athermal applications, which do not experience heat or a change in temperature or which do not use the materials for a heat management function. Examples of athermal applications are density-increasing filler materials for adding weight to outdoor articles, ultraviolet light-blocking materials, membranes, and athermal adhesives or greases.

The invention is further illustrated by, and an invention embodiment may include any combinations of features and limitations of, the non-limiting examples thereof that follow. Ambient temperature is about 23° C. unless indicated otherwise.

EXAMPLES $^{29}$Si-NMR instrument and solvent: a Varian 400 MHz Mercury spectrometer was used. $C_6D_6$ was used as the solvent.

Dynamic Viscosity Test Method 1: use 0.1% strain and 25° C., and follow ASTM D4440-15 (*Standard Test Method for Plastics: Dynamic Mechanical Properties Melt Rheology*) promulgated by ASTM International (formerly American Society for Testing and Materials), West Conshohocken, Pa., USA. This test method may use a mechanical or dynamic spectrometer and provides a simple means of characterizing the important rheological properties and viscosity of thermoplastic polymers using a test sample that is 25 to 50 mm in diameter and 1 to 3 mm in thickness. Used an ARES G2 rheometer with the following conditions: 25 mm diameter stainless steel parallel plates; 0.6 mm gap; angular frequency of 10.0 radians per second (rad/s); data collected from 0.01% to 300.0% strain with 20 measurement points per decade; temperature 25° C. Data acquisition mode: correlation, 0.5 delay cycles, I/O second (s) delay time. Measurement standard deviation: ±150 pascal-seconds.

Durometer Hardness Test Method 1: use a Type A (Shore A) durometer and an indentor; and follow ASTM D2240-15 (Standard Test Method for Rubber Property-Durometer Hardness) promulgated by ASTM International. This test method is based on the penetration of a specific type of indentor when forced into the material under specified conditions. The indentation hardness is inversely related to the penetration and is dependent on the elastic modulus and viscoelastic behavior of the material. Measurements were made on a Shore Instruments model number 902 durometer instrument with an automatic operating stand.

Particle Size Test Method 1: particle size may be determined with a sample of solid particles in dry form or dispersed in a dispersant (e.g., water) using laser diffraction or particle size analyzer instrument. For example, the MALVERN MASTERSIZER S particle size analyzer instrument (Malvern Instruments, Malvern, Worcestershire, UK) may be used with particles having a size in the range of from 300 nm to 1000 μm. The MICROTRAC NANOTRAC UPA150 particle size analyzer instrument (Microtrac, Inc., Montgomeryville, Pa., USA) may be used with particles having a size in the range of from 5 nm to 4 μm. Atomic force microscopy (AFM), scanning electron microscopy (SEM) or transmission electron microscopy (TEM) may be used to measure the particle sizes after the particles have been dispersed in the metal-polyorganosiloxane material.

Test Method for Determining Thermal Conductivity: ISO 22007-2:2015 (Plastics—Determination of thermal conductivity and thermal diffusivity—Part 2: Transient plane heat source (hot disc) method; published by International Organization for Standardization, Geneva, Switzerland) measured at temperature 22° C. ISO 22007-2:2015 specifies a method for the determination of the thermal conductivity and thermal diffusivity, and hence the specific heat capacity per unit volume of plastics. The experimental arrangement can be designed to match different specimen sizes. Measurements can be made in gaseous and vacuum environments at a range of temperatures and pressures. For a sensor having a radius, r, the specimen should have a radius >2r. For example, use a sensor having a radius of 6.4 millimeters (mm), and a specimen (test sample) having a radius >12.8 mm (e.g., 14 mm).

Constituent (A-1): a non-curable poly(methyl,phenyl)siloxane fluid having a kinematic viscosity of 100 centistokes at 25° C. and being free of SiH groups and aliphatically unsaturated organic groups; obtained from Dow Corning Corporation.

Constituent (A-2): a curable vinyl-terminated polydimethylsiloxane fluid having a kinematic viscosity of 75 centistokes at 25° C. and being free of SiH groups; obtained from Dow Corning Corporation.

Constituent (A-3): curable vinyl-terminated polydimethylsiloxane fluid having a kinematic viscosity of 450 centistokes at 25° C. and being free of SiH groups; obtained from Dow Corning Corporation.

Constituent (B-1): 1,2-bis(triethoxysilyl)ethane.

Constituent (B-2): 1,2-bis(trimethoxysilyl)decane.

Constituent (C-1): aluminum particles having a 9 μm average diameter.

Constituent (C-2): aluminum particles having a 2 μm average diameter.

Constituent (D-1): zinc oxide particles having a 0.1 μm average diameter.

Constituent (D-2): aluminum oxide particles having a 0.4 μm average diameter.

Constituent (E-1): a SiH-functional crosslinker with an average of 3 SiH groups per molecule and having a dynamic viscosity of 26 centistokes.

Constituent (F-1): cure catalyst comprising a mixture containing 40 wt % of a complex of platinum with 1,3-divinyl-1,1,3,3-tetramethyldisiloxane dispersed in a thermoplastic silicone resin, which resin has 78 mol % phenyl, methylsiloxane D units and 22 mol % dimethylsiloxane D units and a softening point of 80° to 90° C.

Constituent (G-1): 2-phenyl-3-butyn-2-ol.

Constituent (I-1): rheology modifier comprising an asymmetrically end-caped linear polydimethylsiloxane fluid having an average degree of polymerization (Dp) from >100 to 120.

Constituent (S-1): an SiH-functional chain extender comprising 2 SiH groups per molecule and having a dynamic viscosity of 14 centistokes.

In the examples below, for convenience different species of constituent (A) are designated as (A-1), (A-2), and (A-3). Likewise, different species of constituent (B) are designated as (B-1) and (B-2). Likewise, different species of constituent (C) are designated as (C-1) and (C-2). Species of constituents (D), (E), (F), (G), (I) are also designated in a like manner. Different species of constituent (B'-C') are designated according to the species of constituents (B) and (C) from which they were synthesized. For example, a species of constituent (B'-C') that was prepared from species (B-1) and (C-1) is designated as (B'-1-C'-1), whereas a species of constituent (B'-C') that was prepared from species (B-2) and (C-1) is designated as (B'-2-C'-1).

Inventive Examples (IEx.) 1a and 1b (actual): non-curable metal-polyorganosiloxane mixtures. Mixed 5.1 grams (g) of a (A-1); 0.17 g of either (B-1) (in IEx. 1a) or (B-2) (in IEx. 1 b); 50.2 g of (C-1); 25.1 g of (C-2); 17.4 g of (D-1); and 2.0 g (I-1) to give 100 grams of a metal-polyorganosiloxane mixture of IEx. 1a or 1b, respectively. The metal-polyorganosiloxane mixture of IEx. 1a comprises the constituents (A-1), (B-1), (C-1), (C-2), (D-1) and (I-1). The metal-polyorganosiloxane mixture of IEx. 1b comprises the constituents (A-1), (B-2), (C-1), (C-2), (D-1) and (I-1).

IEx. 1c and 1d (actual): non-curable metal-polyorganosiloxane compositions. Separately heat the metal-polyorganosiloxane mixtures of IEx. 1a and IEx. 1b at 150° C. to cause a separate reaction between the (B-1) or (B-2) and each of the (C-1) and (C-2) to give a metal-polyorganosiloxane composition of IEx. 1c or 1d, respectively. The metal-polyorganosiloxane composition of IEx. 1c comprises the constituents (A-1), (B'-1-C'-1), (B'-1-C'-2), (D-1) and (I-1), wherein (B'-1-C'-1) is 1,2-ethylene-based multipodal silanoxy-functionalized aluminum particles having 9 μm average diameter and (B'-1-C'-2) is 1,2-ethylene-based multipodal silanoxy-functionalized aluminum particles having 2 μm average diameter. The metal-polyorganosiloxane composition of IEx. 1d comprises the constituents (A-1), (B'-2-C'-1), (B'-2-C'-2), (D-1) and (I-1), wherein (B'-2-C'-1) is 1,2-decylene-based multipodal silanoxy-functionalized aluminum particles (having a pre-reaction average diameter of 9 μm) and (B'-2-C'-2) is 1,2-decylene-based multipodal silanoxy-functionalized aluminum particles (having a pre-reaction average diameter of 2 μm). The compositions of IEx. 1c and 1d independently are useful as thermal greases.

IEx. 1e and 1f (actual): thermally-aged non-curable composition. Separately heated the non-curable metal-polyorganosiloxane composition of IEx. 1c or 1d, respectively, at a temperature of 150° C. for 42 days to give the thermally aged non-curable compositions of IEx. 1e and 1f, respectively. Measured viscosity at 0.1% strain at Day 0 (before heating), Day 7, Day 14, Day 28, and Day 42. Report viscosity in Pascal-seconds (Pa-s) below in Table 1. The thermally-aged non-curable compositions of IEx. 1e and 1f independently are useful as thermal greases.

TABLE 1

Viscosity of thermally aged non-curable compositions of IEx. 1e and 1f.

| Thermally Aged Composition Ex. No. | Viscosity (Pa-s) | | | | |
|---|---|---|---|---|---|
| | Day 0 | Day 7 | Day 14 | Day 28 | Day 42 |
| IEx. 1e | 1,020 | 1,230 | 1,410 | 1,780 | 1,630 |
| IEx. 1f | 1,130 | 880 | 1,340 | 1,730 | 1,580 |

As shown by the data in Table 1, the inventive materials showed relatively small increases in viscosity upon thermal aging for 42 days. Viscosity increases of non-invention comparative materials (e.g., lacking the constituent (B) or using, in place of constituent (B), an alkoxymonosilane agent would be expected to be significantly larger.

IEx. 2a and 2b (actual): metal-polyorganosiloxane mixtures. Mixed 5.1 g of (A-2); 0.17 g of either (B-1) (in IEx. 2a) or (B-2) (in IEx. 2b); 52.3 g of (C-1); 26.2 g of (C-2); 12.9 g of (D-2); and 2.0 g (I-1) to give 100 grams of a metal-polyorganosiloxane mixture of IEx. 2a or 2b, respectively. The metal-polyorganosiloxane mixture of IEx. 2a comprises the constituents (A-2), (B-1), (C-1), (C-2), (D-2), and (I-1). The metal-polyorganosiloxane mixture of IEx. 2b comprises the constituents (A-2), (B-2), (C-1), (C-2), (D-2), and (I-1).

IEx. 2c and 2d (actual): curable metal-polyorganosiloxane compositions. Separately heated the metal-polyorganosiloxane mixtures of IEx. 2a and IEx. 2b at 150° C. under vacuum (10 Torr; 1.3 kilopascals) for 1 hour (starting when temperature reaches 150° C.) sufficient to cause a separate reaction between the (B-1) or (B-2) and each of the (C-1) and (C-2) to give a first metal-polyorganosiloxane composition of IEx. 2c or 2d, respectively. Cooled each of the first compositions of IEx. 2c and 2d, respectively, to 23° C., and then added 0.82 g of (E-1); 0.05 g of (F-1); 0.003 g of (G-1); and 0.4 g (S-1) to give the curable metal-polyorganosiloxane composition of IEx. 2c or 2d, respectively. The curable metal-polyorganosiloxane composition of IEx. 2c comprises the constituents (A-2), (B'-1-C'-1), (B'-1-C'-2), (D-2), (E-1), (F-1), (G-1), (I-1) and (S-1), wherein (B'-1-C'-1) is 1,2-ethylene-based multipodal silanoxy-functionalized aluminum particles (having a pre-reaction average diameter of 9 μm) and (B'-1-C'-2) is 1,2-ethylene-based multipodal silanoxy-functionalized aluminum particles (having a pre-reaction average diameter of 2 μm). The curable metal-polyorganosiloxane composition of IEx. 2d comprises the constituents (A-2), (B'-2-C'-1), (B'-2-C'-2), (D-2), (E-1), (F-1), (G-1), (I-1) and (S-1), wherein (B'-2-C'-1) is 1,2-decylene-based multipodal silanoxy-functionalized aluminum particles (having a pre-reaction average diameter of 9 μm) and (B'-2-C'-2) is 1,2-decylene-based multipodal silanoxy-functionalized aluminum particles (having a pre-reaction average diameter of 2 μm). The first and curable compositions of IEx. 2c and 2d independently are useful as thermal greases.

IEx. 2e and 2f (actual): cured composites. Separately, heated the curable metal-polyorganosiloxane composition of 2c or 2d, respectively, at 150° C. in a pressed chase (10 tons of pressure were applied to the chase) for 60 minutes to cure same to give the cured composite of IEx. 2e or 2f, respectively. The cured composites of IEx. 2e and 2f independently are useful as thermal gels.

IEx. 2g and 2h (actual): thermally-aged composites. Separately heated the cured composite of IEx. 2e or 2f, respectively, at a temperature of from 140° to 160° C. for from 1 day to 28 days to give the thermally-aged composite of IEx. 2g or 2h, respectively. Repeat the procedure of IEx. 2g to give a second thermally-aged composite of IEx. 2g. Hardness (Shore A) data for IEx. 2g (first and second runs) and 2h are listed below in Table 2.

TABLE 2

Hardness (Shore A) of thermally aged composite of IEx. 2g.

| Thermally Aged Composite Ex. No. | Durometer (Shore A) | | | | |
|---|---|---|---|---|---|
| | Day 0 | Day 7 | Day 14 | Day 21 | Day 28 |
| IEx. 2g (1$^{st}$ run) | 20 | 44 | 52 | 58 | N/m* |
| IEx. 2g (2$^{nd}$ run) | 15 | 53 | 59 | 61 | 64 |
| IEx. 2h | 18 | 53 | 66 | 76 | N/m |

*N/m means not measured.

As shown by the data in Table 2, the inventive examples did not substantially increase in hardness even after being thermally aged at 150° C. for 28 days.

IEx. 3a (actual): curable metal-polyorganosiloxane mixture. Mixed 0.33 g of a (A-2) curable vinyl-terminated polydimethylsiloxane fluid having a kinematic viscosity of 75 centistokes at 25° C.; 6.3 g of (A-3); 0.30 g of (B-1); 49.3 g of (C-1); 24.6 g of (C-2); 16.3 g of (D-1); and 2.3 g (I-1) to give 100 grams of a metal-polyorganosiloxane mixture of IEx. 3a. The curable metal-polyorganosiloxane mixture of IEx. 3a comprises the constituents (A-2), (A-3), (B-1), (C-1), (C-2), (D-1), and (I-1).

IEx. 3b (prophetic): curable metal-polyorganosiloxane mixture (prophetic). Mix 0.33 g of a (A-2) curable vinyl-terminated polydimethylsiloxane fluid having a kinematic viscosity of 75 centistokes at 25° C.; 6.3 g of (A-3); 0.30 g of (B-2); 49.3 g of (C-1); 24.6 g of (C-2); 16.3 g of (D-1); and 2.3 g (I-1) to give 100 grams of a metal-polyorganosiloxane mixture of IEx. 3b. The curable metal-polyorganosiloxane mixture of IEx. 3b comprises the constituents (A-2), (A-3), (B-2), (C-1), (C-2), (D-1), and (I-1).

IEx. 3c (actual): curable metal-polyorganosiloxane composition. Heated the metal-polyorganosiloxane mixture of IEx. 3a at 150° C. for a period of time (60 minutes) sufficient to cause a reaction between the constituent (B-1) and each of the constituents (C-1) and (C-2) to give a first metal-polyorganosiloxane composition of IEx. 3c. Cooled the first composition to 23° C., and then added 0.54 g of (E-1); 0.03 g of (F-1); and 0.002 g (G-1) to give the curable metal-polyorganosiloxane composition of IEx. 3c. The curable metal-polyorganosiloxane composition of IEx. 3c comprises the constituents (A-2), (A-3), (B'-1-C'-1), (B'-1-C'-2), (D-1), (E-1), (F-1), (G-1), and (I-1), wherein (B'-1-C'-1) is 1,2-ethylene-based multipodal silanoxy-functionalized aluminum particles (having a pre-reaction average diameter of 9 μm) and (B'-1-C'-2) is 1,2-ethylene-based multipodal silanoxy-functionalized aluminum particles (having a pre-reaction average diameter of 2 μm). The first and curable compositions of IEx. 3c independently are useful as thermal greases or thermal gels.

IEx. 3d (prophetic): curable metal-polyorganosiloxane composition (prophetic). Heat the metal-polyorganosiloxane mixture of IEx. 3b at 150° C. for a period of time (60 minutes) sufficient to cause a separate reaction between the constituent (B-2) and each of the constituents (C-1) and (C-2) to give a first metal-polyorganosiloxane composition of IEx. 3d. Cool the first composition to 23° C., and then add 0.54 g of (E-1); 0.03 g of (F-1); and 0.002 g (G-1) to give the curable metal-polyorganosiloxane composition of IEx. 3d. The curable metal-polyorganosiloxane composition of IEx. 3d comprises the constituents (A-2), (A-3), (B'-2-C'-1), (B'-2-C'-2), (E-1), (F-1), (G-1), and (I-1), wherein (B'-2-C'-1) is 1,2-decylene-based multipodal silanoxy-functionalized aluminum particles (having a pre-reaction average diameter of 9 μm) and (B'-2-C'-2) is 1,2-decylene-based multipodal silanoxy-functionalized aluminum particles (having a pre-reaction average diameter of 2 μm). The first and curable compositions of IEx. 3d independently are useful as thermal greases and thermal gels.

IEx. 3e (actual): cured composite. Heated the metal-polyorganosiloxane composition of 3c at 150° C. for 60 minutes to cure same to give the cured composite of IEx. 3e. The cured composites of IEx. 3e is useful as a thermal gel.

IEx. 3f (prophetic): cured composite (prophetic). Heat the metal-polyorganosiloxane composition of 3d at 150° C. for 60 minutes to cure same to give the cured composite of IEx. 3f. The cured composite of IEx. 3f is useful as a thermal gel.

IEx. 3g (actual): thermally-aged composite. Heated the cured composite of IEx. 3e at 140° to 160° C. for from 1 day to 42 days to give the thermally-aged composite of IEx. 3g.

The thermally-aged composite of IEx. 3g is useful as a thermal gel. Hardness (Shore A) of thermally aged composite of IEx. 3g is shown later in Table 3.

IEx. 3h (prophetic): thermally-aged composite (prophetic). Heat the cured composite of IEx. 3f at 140° to 160° C. for from 1 day to 42 days to give the thermally-aged composite of IEx. 3h. The thermally-aged composite of IEx. 3h is useful as a thermal gel.

TABLE 3

Hardness (Shore A) of thermally aged composite of IEx. 3g.

| Thermally Aged Composite Ex. No. | Durometer (Shore A) | | | | | |
|---|---|---|---|---|---|---|
| | Day 0 | Day 7 | Day 14 | Day 21 | Day 28 | Day 42 |
| IEx. 3g | 22 | 27 | 30 | 36 | 34 | 35 |

As shown by the data in Table 3, the inventive examples did not substantially increase in hardness even after being thermally aged at 150° C. for 42 days.

The below claims are incorporated by reference here, and the terms "claim" and "claims" are replaced by the term "aspect" or "aspects," respectively. Embodiments of the invention also include these resulting numbered aspects.

What is claimed is:

1. A non-curable metal-polyorganosiloxane mixture that is free of condensation-curable polyorganosiloxane and solid particles other than metal particles and ceramic particles, the metal-organosiloxane mixture otherwise comprising constituents (A) to (C):
   (A) a polyorganosiloxane that is free of silicon-bonded organoheteryl groups;
   (B) a hydrocarbylene-based multipodal silane; and
   (C) metal particles;
   Wherein, when (B) is a multipodal silane having hydrolysable groups, (B) and (C) are capable of reacting to yield (B'-C') hydrocarbylene-based multipodal silanoxy-functionalized metal particles; and wherein either the mixture is free of curable polyorganosiloxane or the mixture is free of a crosslinker.

2. The metal-polyorganosiloxane mixture of claim 1:
   wherein the constituent (A) is at least one polyorganosiloxane of formula (I):

$$[R^1_3SiO_{1/2}]_m[R^2_2SiO_{2/2}]_d[R^3SiO_{3/2}]_t[SiO_{4/2}]_q[Z]_z \quad (I),$$

wherein subscript m is a mole fraction from 0.0025 to 0.05; subscript d is a mole fraction from >0.90 to 0.9975; subscript t is a mole fraction from 0.00 to 0.05; subscript q is a mole fraction from 0.00 to 0.05; subscript z is from 0.00 to 0.05; the sum of m+d+t+q+z=1; each $R^1$ is independently hydrogen, $(C_1\text{-}C_6)$alkyl, $(C_2\text{-}C_6)$alkenyl, or $(C_2\text{-}C_6)$alkynyl; each $R^2$ is independently hydrogen, $(C_1\text{-}C_6)$alkyl, $(C_2\text{-}C_6)$alkenyl, or $(C_6\text{-}C_{10})$aryl; each $R^3$, when present, is independently hydrogen, $(C_1\text{-}C_6)$alkyl, $(C_2\text{-}C_6)$alkenyl, or $(C_6\text{-}C_{10})$aryl; and each Z, when present, is independently a hydrocarbon-diyl, wherein each radical is on a same or different carbon atom of the hydrocarbon-diyl and is bonded to a different silicon atom of the polyorganosiloxane of formula (I).

3. The metal-polyorganosiloxane mixture of claim 1, wherein constituent (B) the hydrocarbylene-based multipodal silane is:
   (i) a hydrocarbylene-based dipodal silane of formula (II):

$$X_3Si\text{—}Y^1\text{—}SiX_3 \quad (II)$$

wherein $Y^1$ is a ($C_2$-$C_{30}$) hydrocarbon-diyl and each silicon atom in formula (II) is bonded to a same or different carbon atom in Y1; or (ii) a hydrocarbylene-based tripodal silane of formula (III)

$$X_3Si—Y^2(SiX_3)—SiX_3 \qquad (III)$$

wherein $Y^2$ is a ($C_2$-$C_{30}$)hydrocarbon-diyl and each silicon atom in formula (III) is independently bonded to a same or different carbon atom in $Y^2$; and wherein in each formula (II) and (III), each X is independently a monovalent leaving group selected from halogen, ($C_1$-$C_6$)alkoxy, ($C_2$-$C_6$)carboxy, and ($C_2$-$C_6$)oximo.

4. The metal-polyorganosiloxane mixture of claim 2, wherein constituent (B) the hydrocarbylene-based multipodal silane is any one of (i) to (xvi):
   (i) a 1',2'-bis(tri(($C_1$-$C_6$)alkoxy)silyl)ethyl-benzene;
   (ii) a bis(tri(($C_1$-$C_6$)alkoxy)silyl)($C_1$-$C_{12}$)alkane;
   (iii) a bis(tri(($C_1$-$C_6$)alkoxy)silyl)($C_2$-$C_{12}$)alkane;
   (iv) a 1,2-bis(tri(($C_1$-$C_6$)alkoxy)silyl)($C_2$-$C_{12}$)alkane;
   (v) a 1,2-bis(tri(($C_1$-$C_6$)alkoxy)silyl)ethane;
   (vii) a 1,2-bis(tri(($C_1$-$C_6$)alkoxy)silyl)propane;
   (vii) a 1,2-bis(tri(($C_1$-$C_6$)alkoxy)silyl)butane;
   (viii) a 1,2-bis(tri(($C_1$-$C_6$)alkoxy)silyl)pentane;
   (ix) a 1,2-bis(tri(($C_1$-$C_6$)alkoxy)silyl) hexane;
   (x) a 1,2-bis(tri(($C_1$-$C_6$)alkoxy)silyl)heptane;
   (xi) a 1,2-bis(tri(($C_1$-$C_6$)alkoxy)silyl)octane;
   (xii) a 1,2-bis(tri(($C_1$-$C_6$)alkoxy)silyl)nonane;
   (xiii) a 1,2-bis(tri(($C_1$-$C_6$)alkoxy)silyl)decane;
   (xiv) a 1,2-bis(tri(($C_1$-$C_6$)alkoxy)silyl)undecane;
   (xv) a 1,2-bis(tri(($C_1$-$C_6$)alkoxy)silyl)dodecane; and
   (xvi) a 1,3-substituted regioisomer of any one of (vi) to (xv).

5. The metal-polyorganosiloxane mixture of claim 1, wherein the constituent (C) the metal particles comprise aluminum, wherein the aluminum particles have an average particle size of greater than 1 micrometer; beryllium; bismuth; cobalt; copper; gold; indium; iron; nickel; palladium; platinum; silver; tin; titanium; zinc; an alloy of any two of aluminum, beryllium; bismuth, cobalt, copper, gold, indium, iron, nickel, palladium, platinum, silver, tin, titanium, and zinc; or wherein the constituent (C) the metal particles have core-shell structure wherein the shell comprises aluminum, beryllium, bismuth, cobalt, copper, gold, indium, iron, nickel, palladium, platinum, silver, tin, titanium, or zinc; and the core comprises or consists essentially of a support material.

6. The metal-polyorganosiloxane mixture of claim 1, further comprising:
   at least one of optional constituents (D) to (R): (D) ceramic particles; (G) a catalyst inhibitor, which is effective at 23 degrees Celsius (° C.) for inhibiting curing catalyzed by constituent (F); (H) an adhesion promoter; (I) a rheology modifier; (J) an antioxidant; (K) a thixotropic agent; (L) a colorant; (M) a coupling initiator, which is effective for initiating a condensation reaction between constituent (B) and constituent (C); (N) a vehicle selected from a solvent, a diluent, and a dispersant; (O) a reactive diluent; (P) an acid acceptor; (Q) a corrosion inhibitor; (R) a radical cure initiator, which is effective for initiating a radical addition reaction between two or more molecules of constituent (A) wherein constituent (A) is a radical-curable polyorganosiloxane containing an average, per molecule, of at least 1 aliphatically unsaturated organic group.

7. The metal-polyorganosiloxane mixture of claim 1 or claim 6, wherein, when the metal-polyorganosiloxane mixture does not comprise constituent (D) ceramic particles, the metal-polyorganosiloxane mixture is characterized by amounts of its constituents (A) to (C) plus any optional constituents, wherein the amount of the constituent (C) metal particles is from 40 to 95 weight percent of the metal-polyorganosiloxane mixture, the amount of constituent (B) the hydrocarbylene-based multipodal silane is from 0.01 to 2 weight percent of the metal-polyorganosiloxane mixture, and the sum of the amount of constituent (A) plus the amount(s) of any optional constituent(s) is from 3 to 58 weight percent of the metal-polyorganosiloxane mixture; all based on a total of 100 weight percent of the metal-polyorganosiloxane mixture; or wherein, when the metal-polyorganosiloxane mixture comprises constituent (D) ceramic particles and the metal-polyorganosiloxane mixture is characterized by amounts of its constituents (A) to (D) plus any optional constituents, wherein the amount of the (C) metal particles is from 15 to 90 weight percent of the metal-polyorganosiloxane mixture, the amount of the (D) ceramic particles is from 5 to 25 weight percent of the metal-polyorganosiloxane mixture, the amount of (B) the hydrocarbylene-based multipodal silane is from 0.01 to 2 weight percent of the metal-polyorganosiloxane mixture, and the sum of the amount of constituent (A) plus the amount(s) of any constituent(s) other than constituents (A) to (D) is from 3 to 58 weight percent of the metal-polyorganosiloxane mixture; all based on a total of 100 weight percent of the metal-polyorganosiloxane mixture.

8. The metal-polyorganosiloxane composition of claim 1 wherein (B) is a multipodal silane having hydrolysable groups and (B) and (C) react to yield (B'-C') hydrocarbylene-based multipodal silanoxy-functionalized metal particles.

9. The metal-polyorganosiloxane composition of claim 8,
   (1) wherein the constituent (A) is a non-curable polyorganosiloxane and the metal-polyorganosiloxane composition is a non-curable metal-polyorganosiloxane composition; or
   wherein the constituent (A) is an addition-curable polyorganosiloxane and the metal-polyorganosiloxane composition is an addition-curable metal-polyorganosiloxane composition; and/or
   (2) wherein the constituent (B'-C') is dispersed in the constituent (A).

10. A method comprising the step of: contacting, under treating conditions, the metal-polyorganosiloxane mixture of claim 1, wherein the constituent (B) multipodal silane has hydrolyzable groups, with a controlled amount of water in the presence of and without curing the constituent (A) so as to enable a condensation reaction to occur between the constituents (B) and (C) wherein the controlled amount of water is less than stoichiometric relative to the amount of hydrolyzable groups of the constituent (B) multipodal silane, thereby obtaining a metal polyorganosiloxane composition that is free of condensation-curable polyorganosiloxane and solid particles other than metal particles and ceramic particles, the metal-organosiloxane composition otherwise comprising: the (A) polyorganosiloxane that is free of silicon-bonded organoheteryl groups; and (B'-C') hydrocarbylene-based multipodal silanoxy-functionalized metal particles.

11. The method of claim 10 wherein the constituent (A) is an addition-curable polyorganosiloxane, the method further comprising the step of contacting, under curing conditions, the metal-polyorganosiloxane composition with constituent (E) a crosslinker reactive with the addition-curable polyorganosiloxane and constituent (F) a cure catalyst so as to enable crosslinking between constituent (E) and constituent (A), thereby obtaining the cured composite.

12. The method of claim 10 wherein the constituent (A) is a non-curable polyorganosiloxane, the method further comprising the step of heating the metal-polyorganosiloxane composition at a temperature from 100° C. to 350° C. for at least 1 day to give the thermally-aged material.

13. A manufactured article comprising a heat conductor component comprising the metal-polyorganosiloxane mixture of claim 1 or the metal-polyorganosiloxane composition of claim 11 or a cured and/or thermally-aged material thereof.

14. The manufactured article of claim 13, wherein the metal-polyorganosiloxane mixture, the metal-polyorganosiloxane composition, cured composite, and/or thermally-aged material is characterized by a thermal conductivity >0.6 W/m-K measured according to test method ISO 22007-2:2015 (Plastics—Determination of thermal conductivity and thermal diffusivity—Part 2: Transient plane heat source (hot disc) method measured at temperature 22 degrees Celsius (° C.).

15. An electronic device, the electronic device comprising components (1) to (3): (1) a heat conductor component comprising the metal-polyorganosiloxane mixture of claim 1, (2) a heat-generating electronic component; and (3) a heat dissipating component; wherein (1) the heat conductor component is disposed between and in thermal communication with the components (2) and (3) in such a way that at least some of the heat generated by (2) the heat generating component is conducted from (2) the heat generating component through (1) the heat conductor component into (3) the heat dissipating component.

16. The method of claim 11, further comprising the step of heating the cured composite at a temperature from 100° C. to 350° C. for at least 1 day to give a thermally-aged composite.

17. The non-curable metal-polyorganosiloxane mixture of claim 1, wherein the mixture is free of curable polyorganosiloxane.

* * * * *